United States Patent
Yang et al.

(10) Patent No.: US 9,646,891 B2
(45) Date of Patent: May 9, 2017

(54) METAL-OXIDE SEMICONDUCTOR FIELD EFFECT TRANSISTOR, METHOD OF FABRICATING THE SAME, AND SEMICONDUCTOR APPARATUS INCLUDING THE SAME

(71) Applicants: Jung-gil Yang, Suwon-si (KR); Tae-yong Kwon, Suwon-si (KR); Xingui Zhang, Suwon-si (KR); Sang-su Kim, Yongin-si (KR)

(72) Inventors: Jung-gil Yang, Suwon-si (KR); Tae-yong Kwon, Suwon-si (KR); Xingui Zhang, Suwon-si (KR); Sang-su Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/605,017

(22) Filed: Jan. 26, 2015

(65) Prior Publication Data
US 2015/0228730 A1    Aug. 13, 2015

(30) Foreign Application Priority Data
Feb. 13, 2014    (KR) .................. 10-2014-0016801

(51) Int. Cl.
*H01L 21/8238*    (2006.01)
*H01L 29/207*    (2006.01)
(Continued)

(52) U.S. Cl.
CPC ........... *H01L 21/823828* (2013.01); *H01L 21/28264* (2013.01); *H01L 21/8252* (2013.01); *H01L 21/8258* (2013.01); *H01L 21/823842* (2013.01); *H01L 27/0605* (2013.01); *H01L 27/092* (2013.01); *H01L 27/0922* (2013.01);
(Continued)

(58) Field of Classification Search
None
See application file for complete search history.

(56) References Cited

U.S. PATENT DOCUMENTS 5,963,788 A * 10/1999 Barron ................ B81C 1/00246
                                                      148/DIG. 105
6,653,698 B2    11/2003 Lee et al.
(Continued)

OTHER PUBLICATIONS

Y. W. Chen, "Effective Work Function Modulation by Aluminum Ion Implantation on HF-Based High-K/Metal Gate PMOSFET", IEEE Electron Device Letters, Nov. 2010, 3pgs, vol. 31, No. 11.
(Continued)

*Primary Examiner* — Fei Fei Yeung Lopez
(74) *Attorney, Agent, or Firm* — Harness, Dickey & Pierce, P.L.C.

(57) ABSTRACT

Example embodiments relate to a metal-oxide semiconductor field effect transistor (MOSFET) of a high performance operating with a necessary threshold voltage while including a channel region formed based on a group III-V compound, and a method of manufacturing the MOSFET. The MOSFET includes a substrate, a semiconductor layer including a group III-V compound on the substrate, and a gate structure disposed on the semiconductor layer, and including a gate electrode formed based on metal and undergone an ion implantation process.

21 Claims, 33 Drawing Sheets

(51) Int. Cl.
  *H01L 27/092* (2006.01)
  *H01L 29/78* (2006.01)
  *H01L 29/49* (2006.01)
  *H01L 29/201* (2006.01)
  *H01L 29/20* (2006.01)
  *H01L 21/8252* (2006.01)
  *H01L 21/8258* (2006.01)
  *H01L 27/06* (2006.01)
  *H01L 21/28* (2006.01)
  *H01L 29/66* (2006.01)

(52) U.S. Cl.
  CPC ...... *H01L 27/0924* (2013.01); *H01L 27/0928* (2013.01); *H01L 29/201* (2013.01); *H01L 29/2003* (2013.01); *H01L 29/207* (2013.01); *H01L 29/4966* (2013.01); *H01L 29/66522* (2013.01); *H01L 29/78* (2013.01); *H01L 29/785* (2013.01)

(56) References Cited

U.S. PATENT DOCUMENTS

| | | |
|---|---|---|
| 6,916,695 B2 | 7/2005 | Wakabayashi et al. |
| 7,022,559 B2 | 4/2006 | Barnak et al. |
| 7,026,218 B2 | 4/2006 | Rotondaro et al. |
| 7,105,891 B2 | 9/2006 | Visokay et al. |
| 7,179,700 B2 | 2/2007 | Adetutu et al. |
| 7,439,113 B2 | 10/2008 | Doczy et al. |
| 7,829,949 B2 | 11/2010 | Tseng et al. |
| 7,989,900 B2 | 8/2011 | Haensch et al. |
| 8,513,081 B2 | 8/2013 | Guo et al. |
| 2001/0015463 A1* | 8/2001 | Wakabayashi .... H01L 21/28088 257/371 |
| 2001/0025972 A1* | 10/2001 | Moriwaki .......... H01L 27/0629 257/296 |
| 2002/0058374 A1* | 5/2002 | Kim ................. H01L 21/82384 438/228 |
| 2002/0064964 A1* | 5/2002 | Jang ................. H01L 21/28079 438/740 |
| 2003/0067318 A1* | 4/2003 | Takahashi .......... G01R 31/3008 324/762.02 |
| 2005/0110098 A1* | 5/2005 | Yoshihara ......... H01L 21/82343 257/371 |
| 2008/0001169 A1* | 1/2008 | Lochtefeld .......... H01L 21/2018 257/190 |
| 2010/0038725 A1 | 2/2010 | Chudzik et al. |
| 2010/0044798 A1* | 2/2010 | Hooker ............ H01L 21/82384 257/369 |
| 2013/0214356 A1 | 8/2013 | Cheng et al. |
| 2014/0183597 A1* | 7/2014 | Lee ..................... H01L 29/205 257/190 |
| 2014/0187030 A1* | 7/2014 | Ji ......................... H01L 29/401 438/587 |
| 2014/0370699 A1* | 12/2014 | Kim ................. H01L 21/28008 438/587 |
| 2015/0380407 A1* | 12/2015 | Ji ....................... H01L 27/0922 257/369 |

OTHER PUBLICATIONS

X. Zhou, "30NM Enhancement-Mode IN0.53GA0.47AS MOSFETS on Si Substrates Grown by MOCVD Exhibiting High Transconductance and Low on-Resistance", IEEE, 2012, 4pgs, 978-1-4673-4871-3/12, Hong Kong.

D.H. Kim, "E-Mode Planar LG=35 NM IN0.7GA0.3AS MOSFETS With INPAL2O3HFO2 (EOT=0.8 NM) Composite Insulator", IEEE, 2012, 4pgs, California, Republic of Korea and Texas.

J. J. Gu, "III-V Gate-All-Around Nanowire MOSFET Process Technology From 3D to 4D", IEEE, 2012, 4pgs, U.S.A.

Y. Sun, "Self-Aligned III-V MOSFETS Towards a CMOS of and Manufacturable Technology Solution", IEEE, 2013, 4pgs, New York.

* cited by examiner

METAL-OXIDE SEMICONDUCTOR FIELD EFFECT TRANSISTOR, METHOD OF FABRICATING THE SAME, AND SEMICONDUCTOR APPARATUS INCLUDING THE SAME

CROSS-REFERENCE TO RELATED APPLICATION

This application claims the benefit of priority from Korean Patent Application No. 10-2014-0016801, filed on Feb. 13, 2014, in the Korean Intellectual Property Office, the disclosure of which is incorporated herein in its entirety by reference.

BACKGROUND

The inventive concepts relate to a field effect transistor (FET), and/or to a metal oxide semiconductor FET (MOSFET).

Semiconductor devices are being highlighted as relevant elements in electronic industries due to their characteristics such as a small size, multi-function, and/or low manufacturing costs. The semiconductor devices may include semiconductor memory devices storing logic data, semiconductor logic devices calculating logic data, and hybrid semiconductor devices including a memory element and a logic element. Owing to highly developed electronic industries, demand for semiconductor device characteristics has increased. For example, demand for highly reliable, high speed and/or multi-functional semiconductor devices has gradually increased. In order to satisfy such demand, the internal structure of a typical semiconductor device is increasingly complex, and the semiconductor device is highly integrated.

SUMMARY

The inventive concepts provide a metal oxide semiconductor field effect transistor (MOSFET) configured to operate at high performance by using a necessary threshold voltage while including a channel region formed based on a group III-V compound, and a method of manufacturing the MOSFET.

The inventive concepts provide a semiconductor device including at least two transistors, each including a channel region formed based on a group III-V compound, having different threshold voltages from each other.

Example embodiments of the inventive concepts relate to a metal-oxide semiconductor field effect transistor (MOSFET) including a substrate, a semiconductor layer including a group III-V compound on the substrate, and a gate structure disposed on the semiconductor layer, and further including a metal based gate electrode, the gate structure having undergone an ion implantation process.

The example gate structure may include a dielectric layer between the gate electrode and the semiconductor layer, and the gate electrode may have an ion implanted region formed by the ion implantation process to be adjacent to the dielectric layer.

The gate structure may include a dielectric layer between the gate electrode and the semiconductor layer, a first metal layer on the dielectric layer, and a second metal layer on the first metal layer, and ions are implanted in the first metal layer.

The second metal layer may include a tungsten (W) layer, and the first metal layer comprises titanium nitride (TiN)/titanium aluminum carbide (TiAlC)/TiN layers.

The gate structure may include a dielectric layer between the gate electrode and the semiconductor layer, the gate electrode including at least one TiN layer, and nitrogen (N) ions are implanted into the at least one TiN layer.

The MOSFET may further include a buffer layer formed on the substrate.

The substrate may be a silicon (Si) substrate, and the semiconductor layer may include a channel region including indium gallium arsenide (InGaAs) or indium arsenide (InAs), and the buffer layer may include gallium arsenide (GaAs)/indium phosphate (InP)/indium aluminum arsenide (InAlAs) layers.

The gate electrode may include a metal having a work function of substantially 4.5 eV or greater.

The gate electrode may include at least one of rhenium (Re), iridium (Ir), platinum (Pt), palladium (Pd), and TiN.

The semiconductor layer may include a channel region, a source region, and a drain region, wherein the channel region is under the gate structure, the source region and the drain region are at opposite side surfaces of the channel region, and the MOSFET may be a planar type in which the channel region is flat, or a fin type in which the channel region protrudes from the substrate.

If the semiconductor layer includes InGaAs, the source region and the drain region may include at least one of Si ions and tin (Sn) ions as impurity ions, and if the semiconductor layer is or includes InAs, the source region and the drain region may include at least one of carbon (C) ions, Si ions, and Sn ions as impurity ions.

The MOSFET may further include a buffer layer between the substrate and the semiconductor layer, wherein the substrate may be a Si substrate, the semiconductor layer may include a channel region including InGaAs or InAs, the buffer layer may include GaAs/InP/InAlAs layers, the gate electrode may include TiN/TiAlC/TiN layers, and N ions are implanted into the gate electrode.

The MOSFET may be one of an N-channel MOS (NMOS), a P-channel MOS (PMOS), and a complementary MOS (CMOS).

Another example of the inventive concepts relate to a semiconductor apparatus including a substrate, a buffer layer on the substrate, a semiconductor layer based on a group III-V compound on the buffer layer, and at least two gate structures on the semiconductor layer, each gate structure including a metal based gate electrode having undergone an ion implantation process, wherein the at least two gate structures form at least two transistors with corresponding parts of the semiconductor layer, and the at least two transistors are at least two kinds of transistors having different threshold voltages from each other.

The gate electrodes in the at least two kinds of transistors may have doping concentrations that are different from each other, or may have different ions.

The substrate may include a silicon (Si) substrate, the semiconductor layer may include a channel region including indium gallium arsenide (InGaAs) or indium arsenide (InAs), the buffer layer may include gallium arsenide (GaAs)/indium phosphate (InP)/indium aluminum arsenide (InAlAs) layers, the gate electrode may include titanium nitride (TiN)/titanium aluminum carbide (TiAlC)/TiN layers, and the gate electrodes in the at least two kinds of transistors may have nitrogen (N) ions implanted with different doping concentrations.

The at least two kinds of transistors may configure a logic device.

At least one example embodiment relates to a metal-oxide semiconductor field effect transistor (MOSFET) including a substrate, a semiconductor layer including a group III-V compound on the substrate, and an ion-implanted metal-based gate electrode on the semiconductor layer, wherein a work function of the gate electrode is increased based on at least one of a type and concentration of the implanted one or more ions.

Another example of the inventive concepts relate to a method of manufacturing a metal-oxide semiconductor field effect transistor (MOSFET), the method including forming a buffer layer and a semiconductor layer based on a group III-V compound sequentially on a substrate, forming a gate structure including a metal gate electrode on the semiconductor layer, and adjusting a work function of the gate electrode by implanting ions into the gate electrode.

The forming of the gate structure may include forming a dielectric layer and a dummy gate pattern on the semiconductor layer, forming a spacer on side walls of the dielectric layer and the dummy gate pattern, forming an insulating layer to cover the substrate and a resultant on the substrate, planarizing the insulating layer by an etching process so as to expose an upper surface of the dummy gate pattern, and forming the gate electrode by removing the dummy gate pattern and filling metal in a portion where the dummy gate pattern is removed, wherein in the adjusting of the work function, the ions may be implanted into a lower portion of the gate electrode, which is adjacent to the dielectric layer.

The forming of the gate electrode may include forming a first metal layer on the dielectric layer and forming a second metal layer on the first metal layer, wherein while adjusting the work function, nitrogen (N) ions may be implanted into the first metal layer.

The semiconductor layer may include indium gallium arsenide (InGaAs) or indium arsenide (InAs), the method may include forming a source region and a drain region in the semiconductor layer at opposite sides of the gate structure before or after forming the gate structure, and the source region and the drain region may be formed by implanting at least one of carbon (C) ions, Si ions, and tin (Sn) ions.

In the forming of the gate structure, at least two gate structures may be formed on the semiconductor layer, and in the adjusting of the work function, ions may be implanted into the at least two gate structures under different processing conditions by using a mask so that at least two kinds of gate structures having gate electrodes of different work functions from each other may be obtained.

Another example of the inventive concepts relate to a method of manufacturing a metal-oxide semiconductor field effect transistor (MOSFET), the method including forming a buffer layer on a substrate, forming trenches by etching the buffer layer and the substrate partially, and forming a protrusion structure that protrudes from the substrate and extends in a first direction between the trenches, forming a device isolation layer by filling a part of the trenches with an insulating material, and forming a fin structure protruding from the device isolation layer, wherein the fin structure corresponds to an upper portion of the protruding structure, forming a semiconductor layer based on a group III-V compound to surround the fin structure, forming a gate structure extending in a second direction extending at a desired, or alternatively predetermined angle with respect to the first direction to partially cover the semiconductor layer and the device isolation layer, and including a gate electrode based on metal, and adjusting a work function of the gate electrode by implanting ions in the gate electrode.

The forming of the gate structure may include forming a first dielectric layer extending in the second direction and partially covering the semiconductor layer and the device isolation layer, forming a dummy gate pattern on the first dielectric layer, forming a first spacer on side surfaces of the semiconductor layer and a second spacer on side surfaces of the dummy gate pattern; forming an insulating layer on a resultant on the substrate and planarizing the insulating layer so as to expose an upper surface of the dummy gate pattern; removing the dummy gate pattern and the first dielectric layer, and forming a second dielectric layer on a portion where the dummy gate pattern and the first dielectric layer are removed; and forming a first metal layer and a second metal layer on the second dielectric layer to form the gate electrode, wherein in the adjusting of the work function, ions may be implanted into the first metal layer.

Before or after the adjusting of the work function, the method may further include forming a recess extending in the first direction by partially removing the fin structure, the semiconductor layer, and the first spacer on an outside of the second spacer, and the insulating layer adjacent to the first spacer, and forming a semiconductor layer by using gallium arsenide (InGaAs) or indium arsenide (InAs) in the recess, and forming a source region and a drain region by implanting at least one of carbon (C) ions, silicon (Si) ions, and tin.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
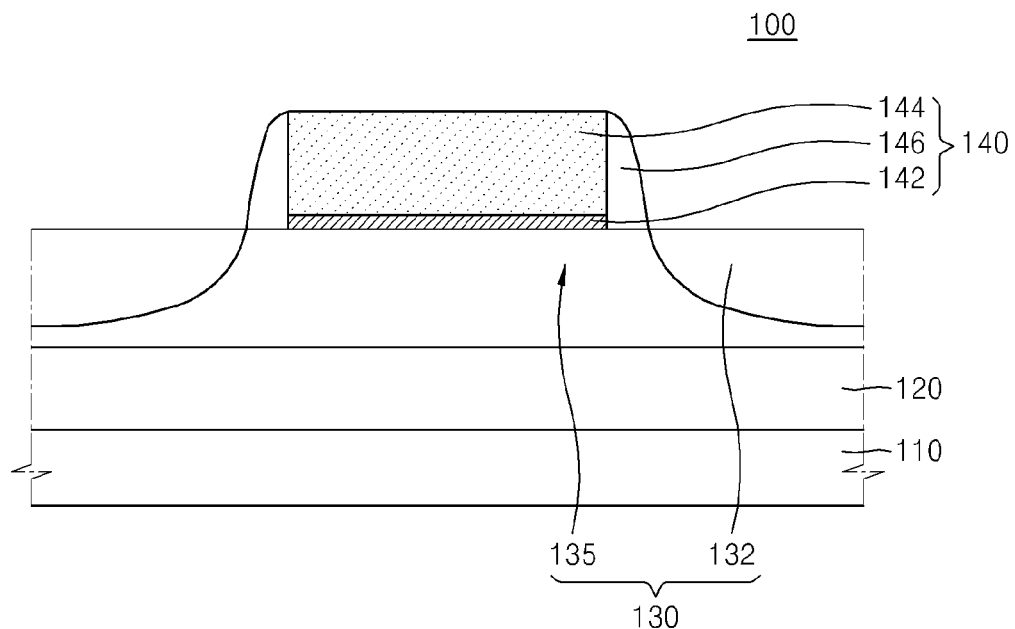
FIG. 1 is a cross-sectional view of a planar-type metal oxide semiconductor field effect transistor (MOSFET) according to an example embodiment.

Hereinafter, the inventive concepts will be described more fully with reference to the accompanying drawings, in which example embodiments of the inventive concepts are shown. Like reference numerals in the drawings denote like elements.

The inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms r is referred to as being ers, it can be the only layer between the two layers,e or more intervening layers may also sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts. For example, a first element may be designated as a second element, and similarly, a second element may be designated as a first element without departing from the teachings of the inventive concepts.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a cross-sectional view of a planar-type metal oxide semiconductor field effect transistor (MOSFET) 100 according to an example embodiment.

Referring to FIG. 1, the MOSFET 100 according to the example embodiment includes a substrate 110, a buffer layer 120, a semiconductor layer 130, and a gate structure 140.

The substrate 110 may be a semiconductor substrate. The semiconductor substrate may be or include a group IV material wafer such as a silicon wafer, or a group III-V compound wafer. Also, the semiconductor substrate may be a single crystalline wafer such as a silicon single crystalline wafer. However, the semiconductor substrate is not limited to the single crystalline wafer, that is, the semiconductor wafer may be an epitaxial wafer, a polished wafer, an annealed wafer, a silicon on insulator (SOI) wafer, etc. Here, the epitaxial wafer denotes a wafer formed by growing a crystalline material on a single crystalline silicon substrate.

According to one or more example embodiments, the substrate 110 may include silicon (Si). According to another example embodiment, the substrate 110 may include a semiconductor atom such as a germanium (Ge), or a compound semiconductor material such as silicon carbide (SiC), gallium arsenide (GaAs), indium arsenide (InAs), and indium phosphide (InP). In the example embodiments of the inventive concepts, the substrate 110 may have an SOI structure. For example, the substrate 110 may include a buried oxide (BOX) layer. In the example embodiments of the inventive concepts, the substrate 110 may include a conductive region, for example, a well doped with impurities, or a structure doped with impurities. According to a kind of impurity ions, the substrate 110 may configure a P-type substrate or an N-type substrate.

The buffer layer 120 may be a layer that lessens differences between grating constants and thermal expansion coefficients of the substrate 110 and the semiconductor layer 130 above the substrate 110. If the substrate 110 and the semiconductor layer 130 are the same material, the buffer layer 120 may be omitted. The buffer layer 120 may be or include a single layer or a multi-layered structure. The buffer layer 120 may have a thickness of about a few μm. The thickness of the buffer layer 120 is not limited thereto.

In some cases, a desired, or alternatively predetermined seed layer may be between the substrate 110 and the buffer layer 120. The seed layer may be a base layer for growing the buffer layer 120. If the buffer layer 120 has a multi-layered structure, seed layers corresponding to the multi layers may be formed.

In the MOSFET 100 of the example embodiment, if the substrate 110 is or includes Si and the semiconductor layer 130 is or includes indium gallium arsenide (InGaAs), the buffer layer 120 may have a triple-layered structure including GaAs/InP/indium aluminum arsenide (InAlAs). However, the buffer layer 120 may further include an InP layer, InGaAs-interlayer (IL), or SiDelta-doped (Si-DD) layer. For example, the buffer layer 120 may have a multi-layered structure including InP/InGaAs-IL/InP/InAlAs/Si-DD/InAlAs. Here, InP may have a thickness that may vary depending on temperature conditions. Also, InAlAs may have a variable thickness. Various material layers such as AlGaAs/GaAs, and i-GaAs, may be included in the buffer layer 120.

The semiconductor layer 130 may be or include a group III-V compound. For example, the semiconductor layer 130 may be or include InAs, GaP, gallium antimony (GaSb), InP, GaAs, InSb, $In_{1-x}Ga_xAs$ (0≤x≤1), etc. In the MOSFET 100 of the example embodiment, the semiconductor layer 130 may be or include InAs or $In_{1-x}Ga_xAs$. In addition, if the semiconductor layer 130 is or includes $In_{1-x}Ga_xAs$, x may be 0.47, but is not limited thereto.

The semiconductor layer 130 may include a source/drain region 132 and a channel region 135. As shown in FIG. 1, the channel region 135 is under the gate structure 140, and the source/drain regions 132 may be at opposite sides of the channel region 135. The semiconductor layer 130 having the above structure may have a thickness of about a few to tens of μm. However, the thickness of the semiconductor layer 130 is not limited to the above range.

Since the channel region 135 is formed based on the semiconductor layer 130, the channel region 135 may be or include various group III-V compound semiconductors that are described above as the materials forming the semiconductor layer 130. The channel region 135 may not be doped with impurity ions. However, the channel region 135 may also be doped with the impurity ions. For example, a fine amount of impurity ions may be added as a dopant on the channel region 135. Meanwhile, the channel region 135 does not include an entire portion of the semiconductor layer 130, but corresponds to a region between the source and drain regions 132, in which a channel is formed. Accordingly, the channel region 135 may include a substantially thin portion of the semiconductor layer 130, which is located under the gate structure 140. For example, the channel region 135 may have a thickness of substantially 100 nm or less, but is not limited thereto.

The group III-V compound configuring the channel region 135 has been considered as a high mobility material that may be a substitute to silicon. For example, group III-V compound semiconductors such as GaAs, InGaAs, InAs, and InP have an electron mobility that is typically superior to the electron mobility of silicon, and thus, has been viewed as a new generation NMOS channel material. In particular, InGaAs has an electron mobility that is about 10 times faster than the electron mobility of silicon while having a bandgap of about 0.75 eV. Thus, InGaAs is typically considered an optimal channel material because leakage may be easily controlled in an off-state while maximizing an on-current.

However, the group III-V compound has a work function that is greater than the work function of silicon, a threshold voltage (Vth) of about 0 V or less when a MOSFET including the channel including the group III-V compound and a metal gate is configured, and thus, a threshold voltage of substantially 0.3 V or greater may not be obtained. In general, in order to operate the MOSFET stably, a threshold voltage of substantially 0.2 V or greater is necessary, and in particular, a threshold voltage of substantially 0.3 V or greater may be necessary for optimally operating the MOSFET.

The threshold voltage Vth may be calculated by using equation (1).

$$Vth = \phi_{ms} - (Q_{ox} + Q_d)/C_{ox} + 2\phi_f \quad (1)$$

Here, $\phi_{ms}$ denotes a potential difference between work functions of the metal forming the gate and the semiconductor forming the channel, $Q_{ox}$ is a fixed charge at a surface of a gate oxide layer, $Q_d$ is a positive charge in an ion layer, $C_{ox}$ is a capacitance per unit area of the gate, $\phi_f$ denotes a potential difference between an intrinsic Fermi level (Ei) and a semiconductor Fermi level (Ef).

According to equation (1), the following steps may be performed in order to adjust the threshold voltage Vth. First, $\phi_m$, may be adjusted. Second, $Q_{ox}$ may be adjusted, and third, $\phi_f$ may be adjusted.

For example, the above first step may be performed by doping the semiconductor or the metal with ions. That is, the work function of the semiconductor or the metal may be increased or reduced by doping the semiconductor or the metal with ions, and thus, the difference between the work functions of the semiconductor and the metal may be increased or reduced. According to the second step, a value of $Q_{ox}$ may be increased or reduced, and accordingly, when the value of $Q_{ox}$ is reduced, the threshold voltage Vth is reduced, and when the value of $Q_{ox}$ is increased, the threshold voltage Vth is increased according to equation (1). Meanwhile, $Q_{ox}$ may be expressed as $\in_0 \in_R / t_{ox}$, in which $\in_R$ denotes a dielectric constant of the gate and $t_{ox}$ denotes a thickness of the gate. Thus, in order to reduce the value of $Q_{ox}$, the thickness of the gate may be increased or a material having a low dielectric constant may be used. In addition, the third step may be performed by doping the semiconductor with ions. For example, if the semiconductor layer is formed as a p-type substrate, the semiconductor layer may be doped with As in order to increase a value of $\phi_f$.

However, in the MOSFET 100 using the group III-V compound as the channel according to an example embodiment, doping the semiconductor forming the channel region with the ions causes an increase in an ionized impurity scattering, thereby reducing the mobility. Therefore, doping of the semiconductor with the ions in the above first and third steps may not be used. Also, the second step may not be performed easily in a case where the metal forming the gate and a size of the metal have been determined. Therefore, in the MOSFET according to an example embodiment, the metal may be doped with ions in order to increase the threshold voltage Vth. The doping of the metal with the ions for increasing the work function or the threshold voltage Vth will be described later in more detail with reference to a graph of FIG. 3.

The source and drain regions 132 may be formed by doping the semiconductor layer 130 based on the group III-V compound with impurity ions. In general, if the semiconductor layer 130 includes a group III-V compound is used, a tetravalent carbon family element is used as the impurity ions in order to realize a P-channel MOS, that is, PMOS, and a divalent alkali earth metal element may be used as the impurity ions in order to realize an N-channel MOS, that is, NMOS. However, the impurity ions are not limited to the carbon family or the alkali earth metal when configuring the PMOS or the NMOS, but elements of other families or metals may be used as the impurity ions.

For example, if the semiconductor layer 130 configuring the channel region 135 includes InGaAs, a desired, or alternatively predetermined region of the semiconductor layer 130 may be doped with ions of beryllium (Be), manganese (Mg), zinc (Zn), carbon (C), or the like in order to realize the PMOS, thereby forming the source and drain regions 132. In addition, the desired, or alternatively predetermined region of the semiconductor layer 130 may be doped with ions of Si, Sn, or the like in order to realize the NMOS, thereby forming the source and drain regions 132.

Also, if the semiconductor layer 130 is or includes InAs, the desired, or alternatively predetermined region of the semiconductor layer 130 may be doped with ions of Be, Zn, Cd, or the like to realize the PMOS, thereby forming the source and drain regions 132. In addition, the desired, or alternatively predetermined region of the semiconductor layer 130 may be doped with ions of C, Si, Sn, or the like to realize the NMOS, thereby forming the source and drain regions 132.

The impurity ions used to form the source and drain regions 132 are not limited to the above examples. For example, various impurity ions may be used according to a kind of group III-V compound forming the semiconductor layer, and whether the PMOS or NMOS is to be formed.

The gate structure 140 may include a dielectric layer 142, a gate electrode 144, and a spacer 146.

The dielectric layer 142 may be on the semiconductor layer 130, for example, on the channel region 135. If necessary, the dielectric layer 142 may be on an entire upper surface of the semiconductor layer 130. The dielectric layer 142 may have a thickness of about 2.2 nm to about 3 nm, but is not limited thereto.

The dielectric layer 142 may be or include an oxide material such as $SiO_2$ or a nitride material such as SiNx. In addition, the dielectric layer 142 may be or include a dielectric material having a high-k value. For example, the dielectric layer 142 may include hafnium oxide ($HfO_2$), hafnium silicon oxide ($HfSiO_2$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanate ($SrTiO_3$), Yttrium oxide ($Y_2O_3$), aluminum oxide ($Al_2O_3$), lead scandium tantalate ($PbSc_{0.5}Ta_{0.5}O_3$), lead zinc niobate ($PbZnNbO_3$), etc. In the MOSFET 100 of an example embodiment, the dielectric layer 142 may be or include a metal oxide such as $HfO_2$, $ZrO_2$, $TiO_2$, and $Al_2O_3$, silicates or aluminates thereof.

Also, the dielectric layer 142 may be or include metal oxynitride such as aluminum oxynitride (AlON), zirconium oxynitride (ZrON), hafnium oxynitride (HfON), lanthanum oxynitride (LaON), and Yttrium oxynitride (YON), silicates or aluminates thereof. The silicates or aluminates may be, for example, ZrSiON, HfSiON, LsAiON, YsiON, ZrAlON, HfAlON, etc.

Moreover, the dielectric layer 142 may be or include perovskite-type oxides, niobate or tantalite system materials, tungsten-bronze system materials, bi-layered perovskite system materials, etc.

The dielectric layer 142 may be formed by various deposition methods such as chemical vapor deposition (CVD), low pressure CVD (LPCVD), atmospheric pressure CVD (APCVD), low temperature CVD (LTCVD), plasma enhanced CVD (PECVD), atomic layer CVD (ALCVD), atomic layer deposition (ALD), and physical vapor deposition (PVD).

The gate electrode 144 may be or include a metal. The gate electrode 144 may be formed on the dielectric layer 142 to have a single-layered structure or a multi-layered structure. The gate electrode 144 may have a thickness of about 20 nm to about 30 nm. The thickness of the gate electrode 144 is not limited to the above range.

The gate electrode 144 may be or include a metal having a substantially high work function in order to increase a difference from the work function of the semiconductor layer 130 including the group III-V compound. For example, the gate electrode 144 may be or include Hf, Zr, Ta, Al, or an alloy thereof, which have a work function of about 3.9 eV to about 4.2 eV. The alloy may be or include a metal carbide including one or more of the above metals, for example, hafnium carbide (HfC), zirconium carbide (ZrC), titanium carbide (TiC), tantalum carbide (TaC), or aluminum carbide ($Al_4C_3$).

Also, the gate electrode 144 may be or include ruthenium (Ru), palladium (Pd), platinum (Pt), Cobalt (Co), nickel (Ni), tungsten (W), molybdenum (Mo), and a conductive metal oxide having a work function of about 4.9 eV to about 5.2 eV. The conductive metal oxide may be, for example, ruthenium oxide ($RuO_2$).

In addition, the gate electrode 144 is not limited to the above examples, but may be or include other various metal materials.

In the MOSFET 100 of an example embodiment, the gate electrode 144 may be or include rhenium (Re) having a work function of about 4.72 eV to about 5.0 eV, iridium having a work function of about 5.0 eV to about 5.7 eV, platinum (Pt) having a work function of about 5.32 eV to about 5.5 eV, Pd having a work function of about 4.8 eV to about 5.2 eV, titanium nitride (TiN) having a work function of about 4.7 eV to about 5.0 eV, etc. In addition, the metal having an excessively large work function corresponds to stabilized metal, and has degraded reactivity. Accordingly, it may be difficult to perform an etching process for forming the gate structure.

To address the above issue, the gate electrode 144 may be or include a metal having a relatively low work function without directly forming the gate electrode 144 by using the metal having a relatively high work function, and then, the gate electrode 144 may be doped with ions through an ion-implantation process to increase the work function of the gate electrode 144. For example, the gate electrode 144 may be or include a metal having a work function of about 5.0 eV or lower, and then may be doped with ions through the ion-implantation process to form the gate electrode 144 having the work function of about 5.0 eV or greater.

In the MOSFET 100 of the example embodiment, an ion-implantation process might have been performed with respect to the gate electrode 144 in order to increase a difference from the work function of the group III-V compound semiconductor configuring the channel region 135. That is, the gate electrode 144 may include ions that are implanted through the ion-implantation process. For example, the gate electrode 144 may be or include TiN, TaB, TiC, TaC, or the like, and may then be doped with ions.

The ions implanted to the gate electrode 144 may be, for example, nitrogen (N), oxygen (O), chlorine (Cl), or brome (Br) ions. For example, in the MOSFET 100 of the example embodiment, if the gate electrode 144 is or includes TiN, N ions may be doped on the gate electrode 144. In particular, in the MOSFET 100 of the example embodiment, the gate electrode 144 may have a multi-layered structure of TiN/ titanium aluminum carbide (TiAlC)/TiN, and N ions may be implanted to the gate electrode 144 with about 0.1 to about 1 kV energy to a doping concentration of about $1 \times 10^{16}$ to about $5 \times 10^{16}$ $cm^{-3}$.

In addition, the gate electrode 144 may further include a plurality of metal layers on the TiN layer. If the gate electrode 144 has a multi-layered structure including the TiN layer, an entire thickness of the gate electrode 144 may range from about 20 to about 30 nm and the TiN layer may have a thickness of 5 nm or less.

According the MOSFET 100 of the example embodiment, the ions are implanted to the gate electrode 144 so as to have a threshold voltage of about 0.4 V. The one or more example embodiments are not limited thereto, that is, the threshold voltage may be greater or less than 0.4 V. For example, an appropriate metal may be selected for the gate electrode 144 and the ions may be implanted under appropriate processing conditions, and thus, various threshold voltages, for example, 0.25 V, 0.33 V, or the like, may be realized.

The spacer 146 may correspond to side walls of the dielectric layer 142 and the gate electrode 144. The spacer 146 may be or include silicon nitride or silicon oxide. For example, the spacer 146 may be or include SiNx. The spacer 146 may be obtained by forming an SiNx layer by depositing SiNx on an entire surface of the substrate in the PECVD or LPCVD method, and removing a part of the SiNx layer on the gate electrode 144 and the semiconductor layer 130 through an anisotropic etching, etching-back, or the like and maintaining the SiNx layer on sides of the dielectric layer 142 and the gate electrode 144. The spacer 146 may function as a mask with the gate electrode 144 when the source and drain regions 132 are formed in the semiconductor layer 130 through the ion-implantation process.

According to the MOSFET 100 of the example embodiment, the channel region 135 is or includes a semiconductor layer based on the group III-V compound, and the gate electrode 144 in the gate structure 140 is or includes metal having a high work function through the ion-implantation process. Accordingly, the MOSFET 100 of the example embodiment may have a high threshold voltage of 0.3 V or greater while having high mobility, and thus, a reliable MOSFET having high performance and reduced leakage may be obtained.

Also, in a logic device in which various kinds of MOSs, for example, an NMOS, a PMOS, and a CMOS, are disposed on a substrate, a channel region based on the group III-V compound may be used, and various threshold voltages may be set according to the kinds of MOSs by adjusting a kind of ions implanted to gate electrodes or ion doping concentration, and thus, a logic device of high performance and reliability may be configured.

Figure 2:
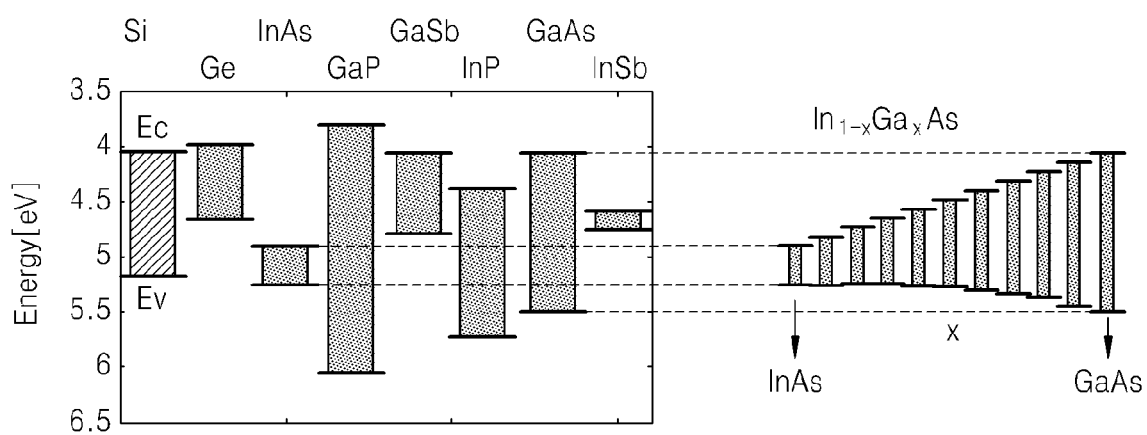
FIG. 2 is a graph illustrating bandgaps of various group III-V compound semiconductors and a band-alignment according to contents of $In_{1-x}Ga_xAs$.

FIG. 2 is a graph illustrating bandgaps of various group III-V compound semiconductors and band-alignments according to example content amounts of $In_{1-x}Ga_xAs$. In the graph of FIG. 2, a left portion shows bandgaps of the group III-V compound semiconductors, and a right portion shows band-alignments, in which bandgaps are arranged sequentially according to a value of x in $In_{1-x}Ga_xAs$ ($0 \leq x \leq 1$).

Referring to FIG. 2, a work function may be generally defined as a difference between a valence band energy level (Ev) and a vacuum level (Eo). That is, the work function denotes a minimum energy that is necessary for an electron bound to a certain material to escape from the material and be a free electron in a free space. In a case of semiconductor, the work function is calculated as a difference between Fermi level (Ef) and the vacuum level (Eo), and the Fermi level Ef may be an intermediate value between the valence band energy Ev and a conduction band energy level Ec when there is no ion doping (Efi).

As shown in FIG. 2, Si has a work function of about 4.55 eV, and the group III-V compound semiconductors have work functions that are mostly greater than the work function of Si. Accordingly, the difference between the metal forming the gate electrode and the group III-V compound semiconductors forming the channel region may be reduced, and thus, the threshold voltage is nearly close to 0 or has a negative (−) value based on the above equation (1) when forming an MOS. Therefore, it may be advantageous to increase the work function of the metal materials forming the gate electrode.

In addition, if $In_{1-x}Ga_xAs$ may be used as the group III-V compound semiconductor forming the channel region, the bandgap varies depending on the value of x as shown in the right portion of the graph, and accordingly, the work function also varies. Therefore, a MOS of high performance may be realized by appropriately selecting the value of x in consideration of the mobility, the bandgap, and the work function. For example, if x is 0.47, that is, $In_{0.53}Ga_{0.47}As$, the mobility may be 10 times faster than the mobility of Si, and at the same time, the bandgap is 0.75 eV. Thus, the leakage during the turning-off state may be controlled while increasing the on-current. However, as described above, since the work function of $In_{0.53}Ga_{0.47}As$ is greater than the work function of Si, it may be difficult to obtain a threshold voltage of 0.3 V or greater. However, in the MOSFET 100 of the example embodiment, the work function may be increased through ion-implantation of the metal gate electrode, and accordingly, the threshold voltage may be increased.

Figure 3:
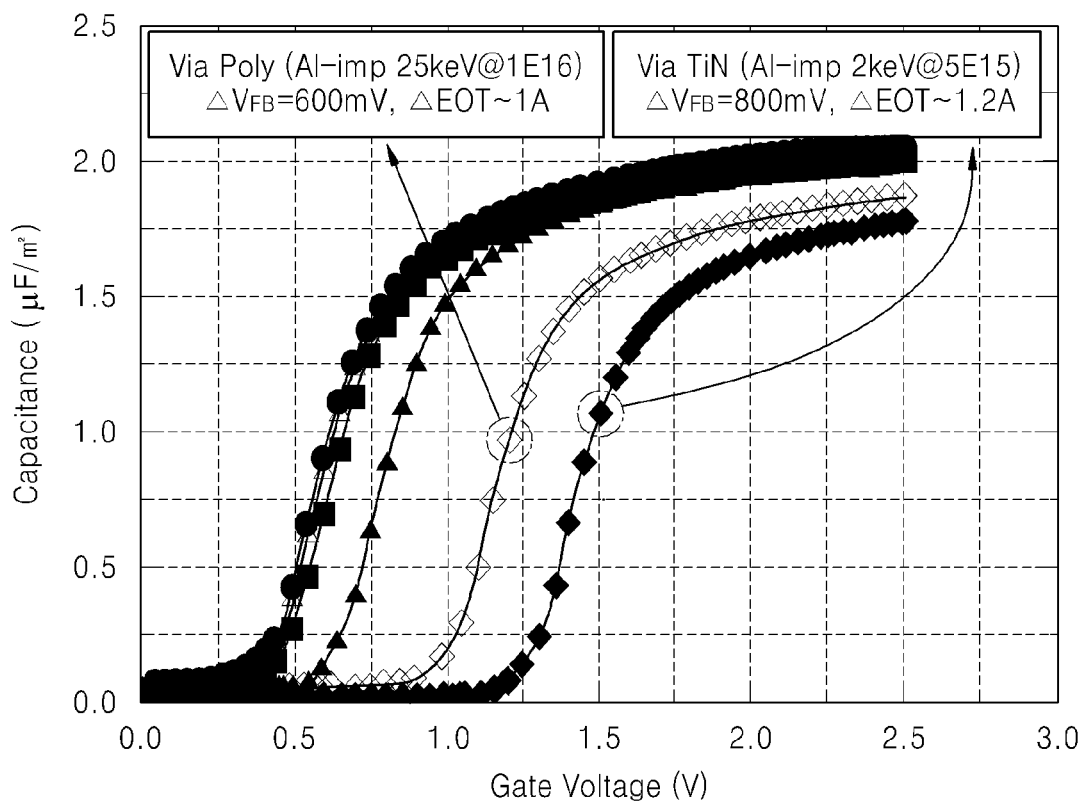
FIG. 3 is a graph illustrating a flatband voltage ($V_{FB}$) moving according to aluminum ion injection into a hafnium-based metal gate.

FIG. 3 is a graph showing that a flatband voltage $V_{FB}$ is moved by implanting Al ions into a metal gate based on Hf.

FIG. 3 illustrates a result of implanting Al ions into a stacked structure of $TiN/HfO_2/SiO_2$ on a Si substrate. The graph corresponding to a left arrow in FIG. 3 is relative to a case where Al ions are implanted into the TiN layer and poly-Si is deposited, and the graph corresponding to a right arrow in FIG. 3 is relative to a case where poly-Si is deposited on the TiN layer and then Al ions are implanted.

As shown in FIG. 3, the flatband voltage $V_{FB}$ increases in both cases, and in particular, the flatband voltage $V_{FB}$ in a case where the Al ions are implanted directly into the TiN layer increases more than the voltage of the other case. This may be interpreted as the performance of increasing the work function may be degraded when the ions are implanted through another material layer, because there may be a loss of ions while passing through the other material layer, or characteristics of the ions are changed. Here, EOT denotes an equivalent oxide thickness in a high-k (HK)/metal gate (MG) structure, and may be reduced in order to maintain a conversion accuracy of the transistor. However, if the EOT is excessively reduced, leakage may increase.

The flatband voltage $V_{FB}$ is a voltage Vg that has to be applied to the gate electrode in order to planarize an energy band on the Si substrate. In an ideal MOS structure, the flatband voltage $V_{FB}$ is a difference ($\phi_{ms}$) between work functions of the gate electrode and Si; however, a surface state exists between Si and a gate oxide layer in an actual MOS device, and a voltage thereof has to be considered. That is, the flatband voltage $V_{FB}$ in an actual MOS device may be obtained by subtracting a difference ($\Delta V_{ox}$) between voltages at opposite terminals of a MOS capacitor caused due to the surface state from an ideal flatband voltage ($\phi_{ms}$).

In addition, when considering that the flatband voltage $V_{FB}$ includes the work function difference ($\phi_{ms}$) as a basic factor, and the threshold voltage Vth includes the work function difference ($\phi_{ms}$) as a basic factor in the above equation (1), it may be appreciated that the flatband voltage $V_{FB}$ is proportional to the threshold voltage Vth. That is, when the flatband voltage $V_{FB}$ increases, the threshold voltage Vth may increase.

That is, according to the graph of FIG. 3, the flatband voltage $V_{FB}$ may be increased by implanting ions in the gate electrode, and accordingly, the threshold voltage may be increased.

FIGS. 4 through 8 are cross-sectional views of a planar-type MOSFET according to one or more example embodiments. For convenience of description, descriptions about the components that have been described with reference to FIG. 1 are omitted.

Figure 4:
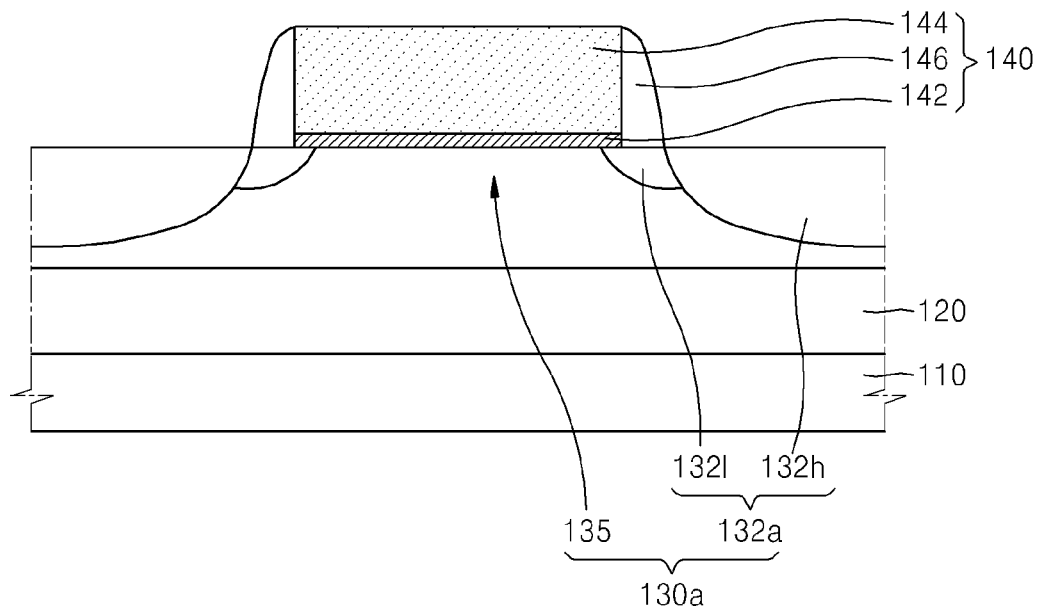
FIGS. 4 through 8 are cross-sectional views of planar-type MOSFETs according to example embodiments.

Referring to FIG. 4, a MOSFET 100a according to the example embodiment may have a structure that is the same as that of the MOSFET 100 shown in FIG. 1, except for source and drain regions 132a in semiconductor layer 130a. That is, in the MOSFET 100a of the example embodiment, the source and drain regions 132a may further include a lightly doped drain (LDD) region 132l formed under the spacer 146. Accordingly, the source and drain regions 132a may include the LDD region 132l and a highly doped impurity region 132h. Here, the highly doped impurity region 132h may correspond to the source and drain regions 132 of FIG. 1.

The LDD region 132l may be formed by implanting ions at a low concentration before forming the spacer 146, and the highly doped impurity region 132h may be formed by implanting ions to a high concentration after forming the spacer 146. The LDD region 132l may be formed to reduce a hot carrier effect and a short-channel effect. In the planar-type MOSFETs according to one or more example embodiments, the LDD region 132l may be or may not be formed according to characteristics of the MOS.

In the MOSFET 100a of the example embodiment, the semiconductor layer 130a configuring the channel region 135 is or includes the group III-V compound semiconductor, and the gate electrode 144 is formed based on a metal in which ions are implanted to generate a high work function. Accordingly, the MOSFET 100a of the example embodiment may have a high mobility and a high threshold voltage.

Figure 5:
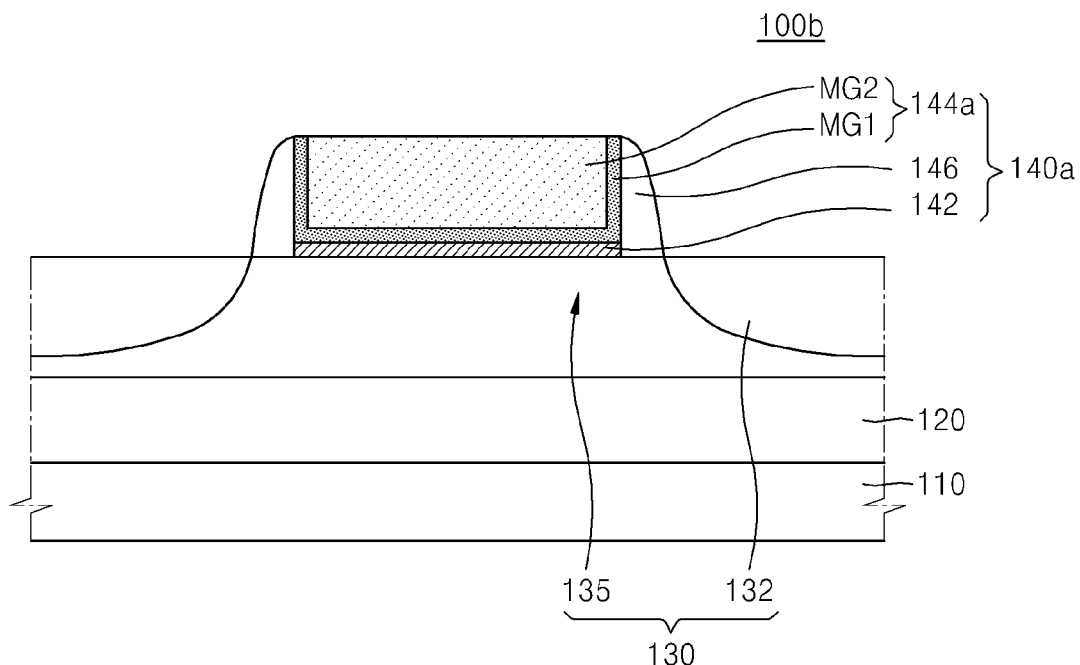

Referring to FIG. 5, a MOSFET 100b of the example embodiment may have a gate structure 140a that is different from the gate structure of the MOSFET 100 of FIG. 1. For example, the gate structure 140a may include the dielectric layer 142, a dual-gate electrode 144a, and the spacer 146. The dielectric layer 142 and the spacer 146 are described above with reference to the MOSFET 100 shown in FIG. 1.

The dual-gate electrode 144a may include a first metal layer MG1 and a second metal layer MG2. The first metal layer MG1 may be a layer in which ions are implanted. For example, the first metal layer MG1 may be a TiN layer. For example, implanted ions may be N ions. The first metal layer MG1 is not limited to the TiN layer. For example, the first metal layer MG1 may be or include various metals described above with reference to the MOSFET 100 of FIG. 1. In particular, the first metal layer MG1 may be or include TaN, TiC, and TaC, as well as TiN.

The second metal layer MG2 may be or include a metal having a high work function and good gap fill property, and may be relatively easily removed through a polishing process. In addition, the second metal layer MG2 may be a layer in which ions are not implanted. That is, the second metal layer MG2 is apart from the channel region 135, and thus, does not largely affect the rising threshold voltage. Accordingly, it may not be necessary to implant ions in the second metal layer MG2. The ion implantation to the second metal layer MG2 may be performed, if necessary. The second metal layer MG2 may be or include, for example, tungsten (W), aluminum (Al), titanium (Ti), TiN, and the like.

The gate electrode 144a may have a thickness of about 20 nm to about 30 nm, and in this case, the first metal layer MG1 may have a thickness of 5 nm or less. However, the thickness of the gate electrode 144a and the thickness of the first metal layer MG1 are not limited to the above examples.

Figure 6:
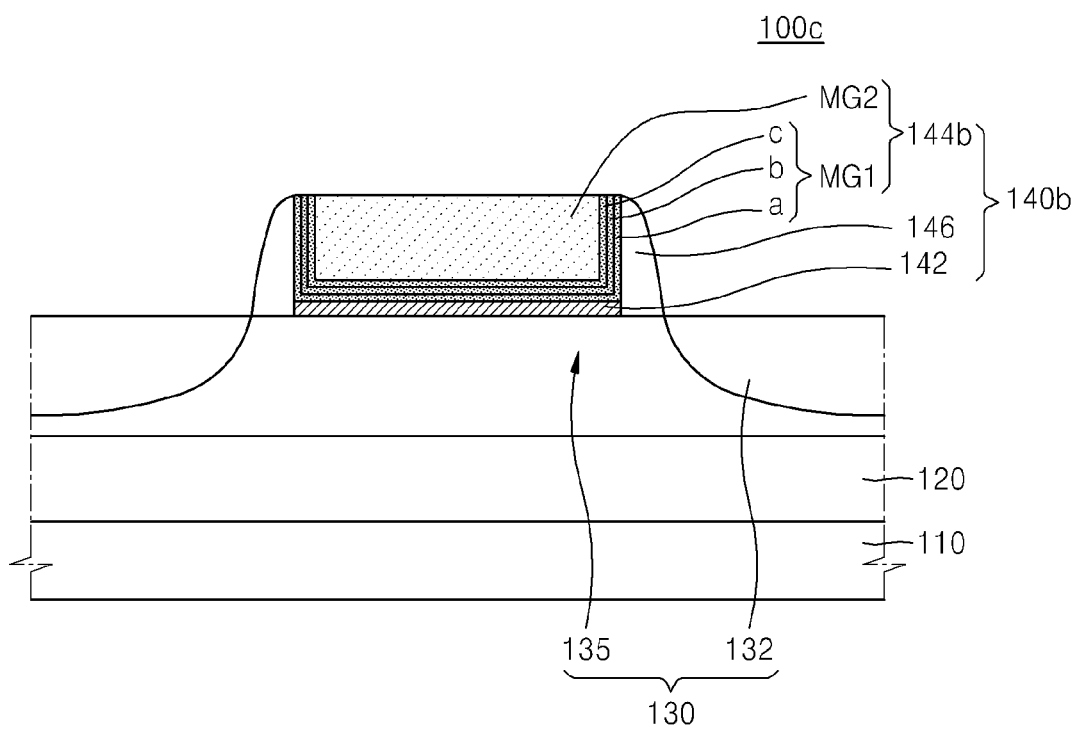

Referring to FIG. 6, a MOSFET 100c according to an example embodiment may be similar to or the same as the MOSFET 100*b* of FIG. 5. However, in the MOSFET 100*c* of the example embodiment, a gate electrode 144*b* may have a different structure from the gate electrode 144*a* in the MOSFET 100*b* of FIG. 5. That is, in the gate electrode 144*b*, the first metal layer MG1 may have a triple-layered structure (a, b, and c). In addition, in the MOSFET 100*c* of the example embodiment, the first metal layer MG1 may be the layer in which ions are implanted, and the second metal layer MG2 is the layer in which ions are not implanted, as in the MOSFET 100*b* of FIG. 5.

In the MOSFET 100*c* of the example embodiment, the first metal layer MG1 may be formed as a TiN/TiAlC/TiN layer. That is, a TiN layer (a) is formed on the dielectric layer 142, a TiAlC layer (b) is formed thereon, and then a TiN layer (c) may be formed. Ions may be implanted into at least one of the three layers. That is, N ions may be implanted to all of the three layers, or may be implanted only in the TiN layer (a) at the lowermost part. In particular, the N ions may be implanted in the first metal layer MG1 including the TiN/TiAlC/TiN layer with an energy of about 0.1 to about 1 kV and a doping concentration of about $1 \times 10^{16}$ to about $5 \times 10^{16}$ cm$^{-3}$.

So far, the first metal layer MG1 is described to have triple-layered structure; however, one or more example embodiments are not limited thereto, that is, the first metal layer MG1 may have dual layers or four or more layers.

Figure 7:
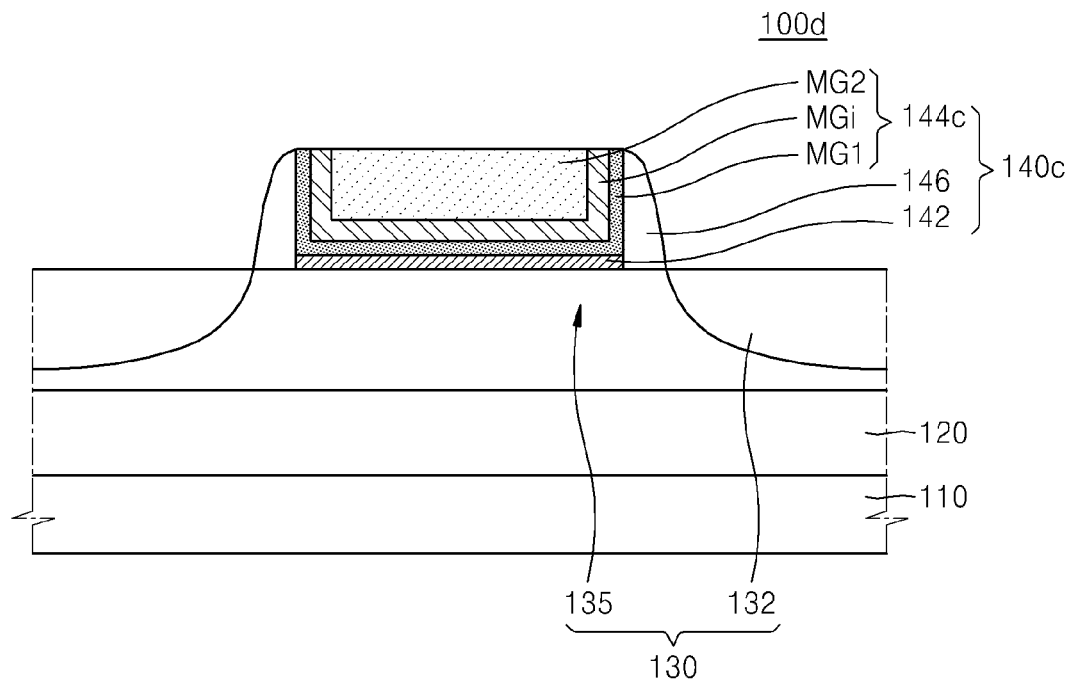

Referring to FIG. 7, a MOSFET 100*d* of the example embodiment may be different from the MOSFET 100*b* of FIG. 5 in view of a gate electrode 144*c* structure. For example, the gate electrode 144*c* may further include an intermediate metal layer MG*i*. That is, the gate electrode 144*c* may include the first metal layer MG1, an intermediate metal layer MG*i*, and the second metal layer MG2. The first and second metal layers MG1 and MG2 are the same as those of the MOSFET 100*b* of FIG. 5.

The intermediate metal layer MG*i* may improve a coupling property between the first and second metal layers MG1 and MG2 if the coupling property between the first and second metal layers MG1 and MG2 is not good, and may attribute to improve a gap fill property of the second metal layer MG2. If necessary, the intermediate metal layer MG*i* may be a seed layer for growing the second metal layer MG2.

In the MOSFET 100*d* of the example embodiment, the intermediate metal layer MG*i* has a single-layered structure; however, the intermediate metal layer MG*i* may have a multi-layered structure. The intermediate metal layer MG*i* may be the layer in which ions are not implanted; however, ions may be implanted in the intermediate metal layer MG*i* if desired.

Figure 8:
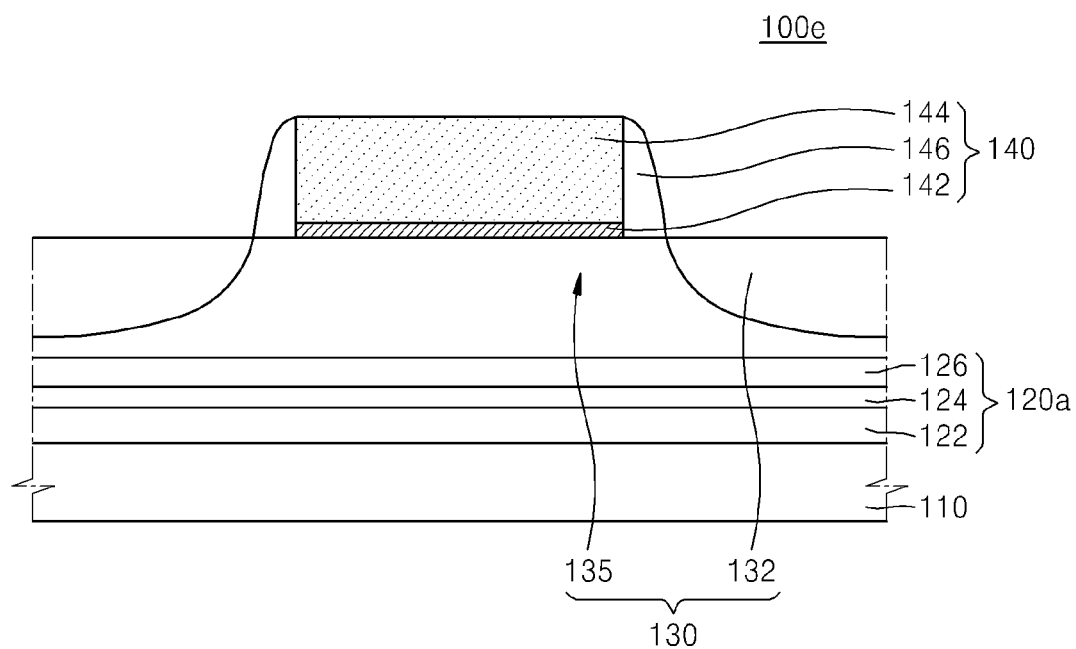

Referring to FIG. 8, a MOSFET 100*e* of the example embodiment may be different from the MOSFET 100 of FIG. 1 in view of a structure of a buffer layer 120*a*. That is, in the MOSFET 100*e* of the example embodiment, the buffer layer 120*a* may be formed to have a multi-layered structure. For example, the buffer layer 120*a* may include a triple-layered structure of GaAs/InP/InAlAs 122, 124, and 126. That is, the buffer layer 120*a* may include a GaAs layer 122, an InP layer 124, and an InAlAs layer 126 that are sequentially stacked on the substrate 110.

As described above with reference to the MOSFET 100 of FIG. 1, the buffer layer 120*a* may include at least one of an InGaAs-interlayer (IL), a silicon delta-doped (Si-DD) layer, an AlGaAs/GaAs, and i-GaAs layer, in addition to the triple layered structure (122, 124, and 126). Accordingly, the buffer layer 120*a* may have four or more layers. The buffer layer 120*a* may also have a dual-layered structure.

FIGS. 9A through 9G are cross-sectional views illustrating processes of manufacturing the MOSFET 100 of FIG. 1. For convenience of description, components that are described above with reference to FIG. 1 may be briefly described or may not be described.

Figure 9A:
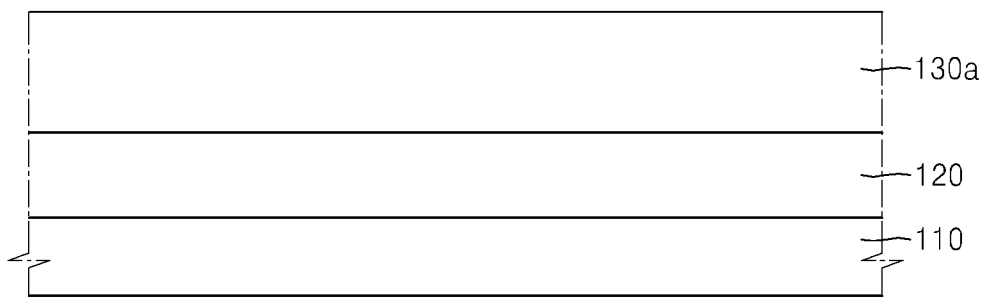
FIGS. 9A through 9G are cross-sectional views of the method of manufacturing the MOSFET of FIG. 1.

Referring to FIG. 9A, according to at least one example embodiment, the buffer layer 120 and the semiconductor layer 130*a* may be formed sequentially on the substrate 110. The substrate 110 may be a semiconductor substrate. For example, the substrate 110 may be a p-type silicon substrate doped with impurities. The substrate 110 is not limited to the P-type silicon substrate. The buffer layer 120 reduces differences between lattice constants and thermal expansion coefficients of the substrate 110 and the semiconductor layer 130*a*, and may have a single-layered structure or a multi-layered structure. For example, the buffer layer 120 may include a triple-layered structure including GaAs/InP/InAlAs.

The semiconductor layer 130*a* may be or include a group III-V compound. For example, the semiconductor layer 130*a* may be or include InAs, GaP, GaSb, InP, GaAs, InSb, In$_{1-x}$Ga$_x$As (0≤x≤1), or the like. In the MOSFET 100 of the example embodiment, the semiconductor layer 130*a* may be or include InAs or In$_{0.53}$Ga$_{0.47}$As.

Figure 9B:
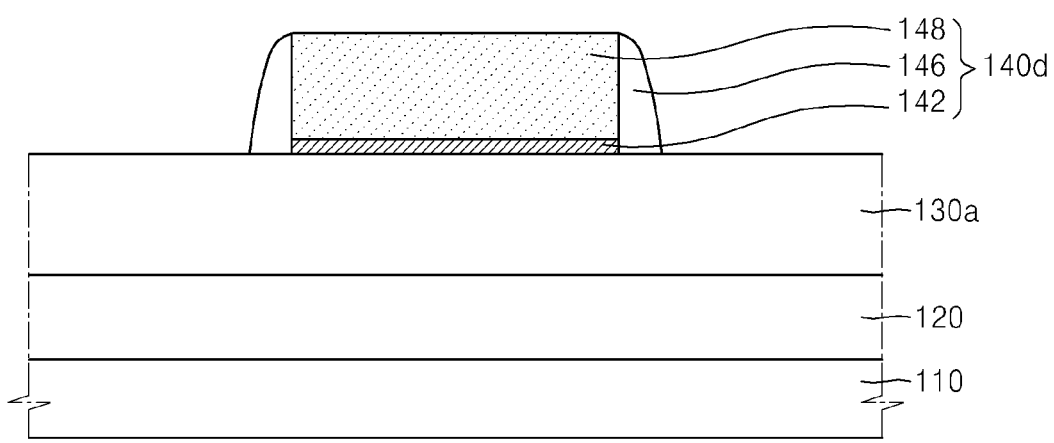

Referring to FIG. 9B, according to at least on example embodiment, a dummy gate structure 140*d* is formed on the semiconductor layer 130*a*. The dummy gate structure 140*d* may include the dielectric layer 142, a dummy gate electrode 148, and the spacer 146. In particular, the dielectric layer 142 is formed on an entire upper surface of the semiconductor layer 130*a*. The dielectric layer 142 may be or include an oxide material such as SiO$_2$, a nitride material such as SiNx, or a high-k dielectric material. If the dielectric layer 142 is or includes the high-k dielectric material, the dielectric layer 142 may be very small in thickness, for example, about 2.2 nm to about 3 nm. The thickness of the dielectric layer 142 is not limited thereto.

The dummy gate electrode 148 is formed on the dielectric layer 142. The dummy gate electrode 148 may be or include, for example, polysilicon. The dummy gate electrode 148 may be removed after forming source and drain regions. The dielectric layer 142 and the dummy gate electrode 148 may be formed by a patterning process such as a photolithography process.

After forming the dielectric layer 142 and the dummy gate electrode 148, a nitride material such as SiNx is applied on an entire surface of the resulting structure on the substrate 110, the SiNx layer being located on the upper surface of the gate electrode 148, and the substrate 110 is removed by the anisotropic etching and/or an etch-back process so as to leave the SiNx only on side surfaces of the dielectric layer 142 and the dummy gate electrode 148. Thus, the spacer 146 including SiNx is obtained.

Figure 9C:
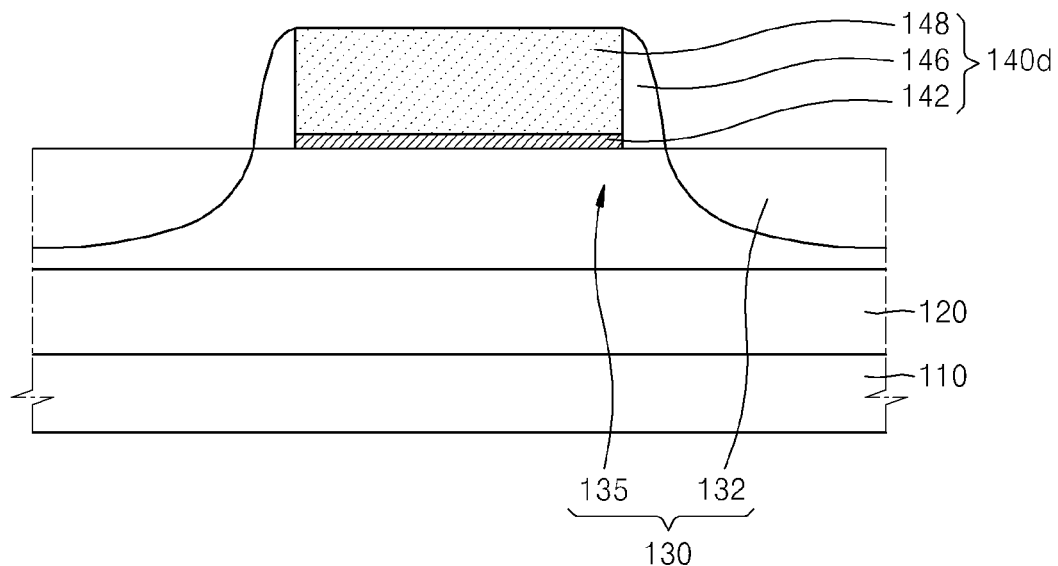

Referring to FIG. 9C, after forming the dummy gate structure 140*d*, impurity ions are implanted in the semiconductor layer 130 by using the dummy gate structure 140*d* as a mask in order to form source and drain regions 132 in the semiconductor layer 130. The source and drain regions 132 may be formed by implanting various ions according to a material of the semiconductor layer 130 and a type of the MOS that is to be manufactured. For example, if the semiconductor layer 130 is or includes InGaAs, then Be, Mg, Zn, or C ions may be implanted in the semiconductor layer 130 in order to form a PMOS. Otherwise, Si or Sn ions may be implanted in the semiconductor layer 130 in order to form an NMOS.

On the other hand, if the semiconductor layer 130 is or includes InAs, then Be, Zn, or Cd ions may be implanted in the semiconductor layer 130 in order to form the PMOS, or C, Si, or Sn ions may be implanted in the semiconductor layer 130 in order to form the NMOS.

In order to form the source and drain regions 132a of the MOSFET 100a shown in FIG. 4, ion implantation is performed to a low concentration before forming the spacer 146, and then, ions of high concentration are implanted after forming the spacer 146. Thus, the source and drain regions 132a of the MOSFET 100a shown in FIG. 4 may be obtained.

Figure 9D:
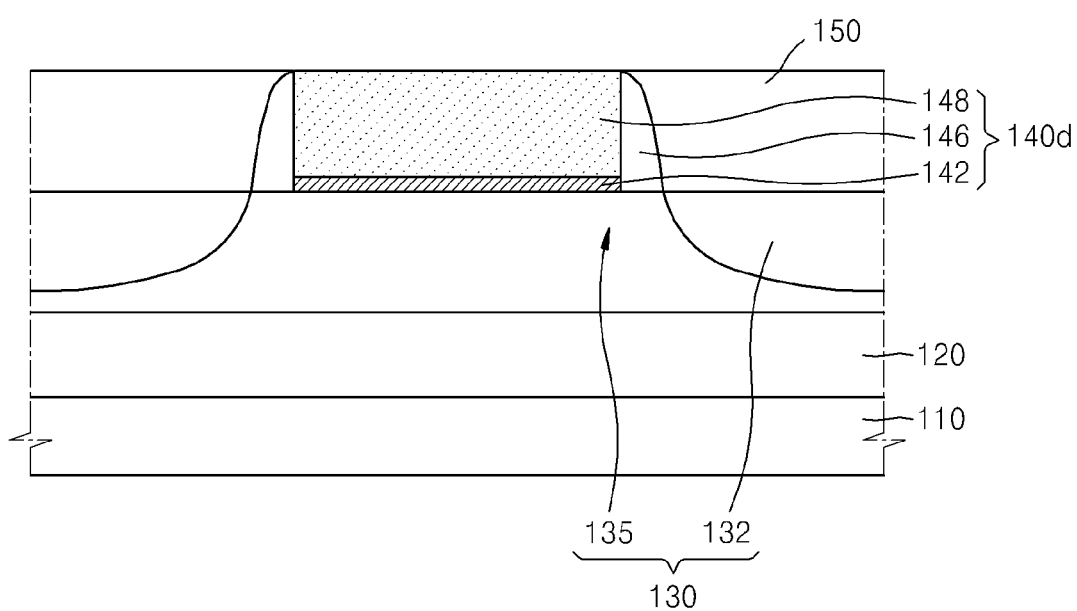

Referring to FIG. 9D, after forming the source and drain regions 132, the insulating layer 150 is formed on a substantially entire surface of the resulting structure on the substrate 110. The insulating layer 150 may be or include an oxide-based or a nitride-based dielectric material. For example, the insulating layer 150 may be or include silicon oxide or silicon nitride. After that, the insulating layer 150 is planarized by a chemical mechanical polishing (CMP) process so as to expose the upper surface of the dummy gate electrode 148. If necessary, a metal silicide layer (not shown) may be formed on the source and drain regions 132 before forming the insulating layer 150.

Figure 9E:
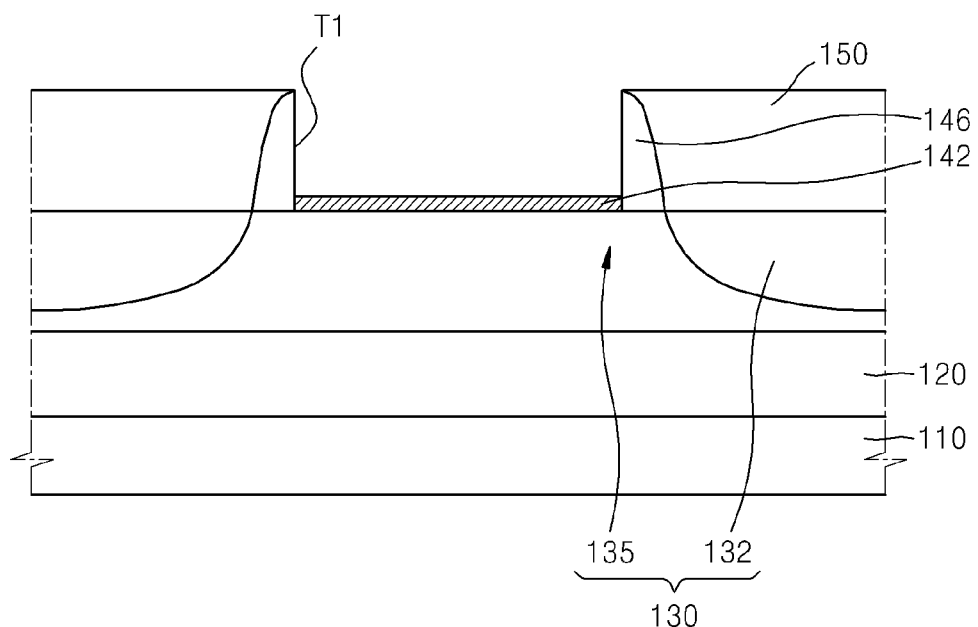

Referring to FIG. 9E, after planarizing the insulating layer 150, the dummy gate electrode 148 is selectively removed by the etching process. The dummy gate electrode 148 may be removed by using an etchant. The etchant may be a solution containing hydroxide, for example, ammonium hydroxide, tetraalkylammonium hydroxide, tetramethylammonium hydroxide (TMAT), or the like. By removing the dummy gate electrode 148, a trench T1 opposite side surfaces of which are surrounded by the spacer 146 may be formed on the dielectric layer 142.

Figure 9F:
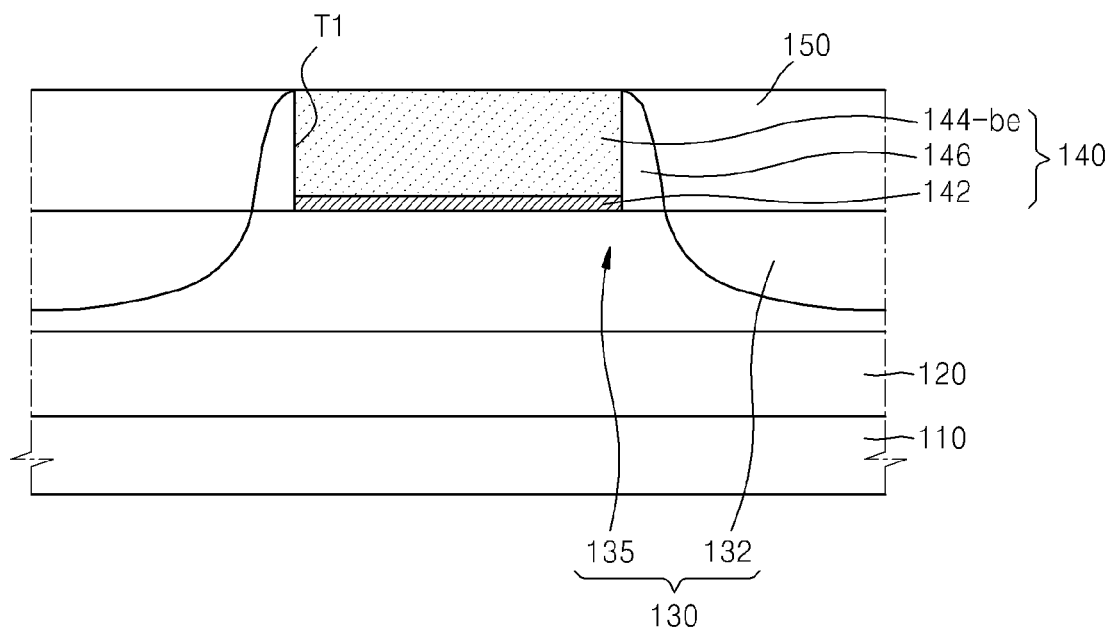

Referring to FIG. 9F, a pre-gate electrode 144-*be* is formed by filling the trench T1 with a metal. In more detail, the pre-gate electrode 144-*be* may be obtained by depositing the metal having relatively high work function described with reference to the MOSFET 100 of FIG. 1 by a PVD or CVD method, and planarizing the deposited metal by a CMP process. The pre-gate electrode 144-*be* may be or include, for example, Re, Ir, W, Al, Ti, TiN, or the like. Here, the pre-gate electrode 144-*be* may denote a gate electrode to which ions are not implanted.

Figure 9G:
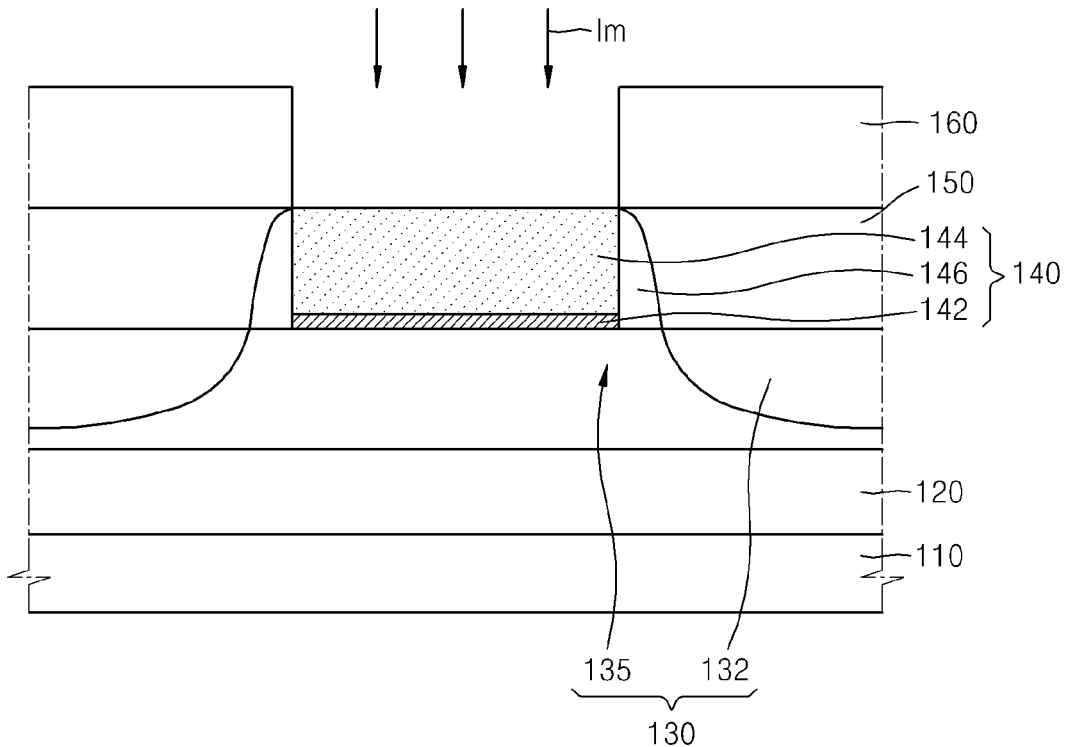

Referring to FIG. 9G, after forming the pre-gate electrode 144-*be*, ions are implanted into the pre-gate electrode 144-*be* as denoted by arrows Im. The implanted ions may be, for example, N, O, Cl, or Br ions. In the MOSFET 100 according to an example embodiment, the pre-gate electrode 144-*be* may be or include TiN, and in this case, the N ions may be implanted to the pre-gate electrode 144-*be* to a desired, or alternatively predetermined doping concentration so as to form the gate electrode 144.

As described above, since the gate electrode 144 in the MOSFET 100 of the example embodiment is formed through ion implantation, the work function may be increased. Accordingly, the MOSFET 100 of the example embodiment may acquire a high threshold voltage even when the channel region is or includes the group III-V compound semiconductor. Here, a reference numeral 160 may denote a mask for implanting ions. After implanting ions, the mask 160 and the insulating layer 150 are removed, and then the MOSFET 100 of FIG. 1 may be obtained. In some cases, the insulating layer 150 may not be removed. In this case, contacts penetrating through the insulating layer 150 may be formed.

FIGS. 9A through 9G describe an example method of manufacturing the MOSFET 100 by using a dummy gate electrode 148 as an example; however, one of ordinary skill in the art would appreciate that the technical scope of the inventive concepts may include a method of forming the gate electrode directly without using the dummy gate electrode 148, and then, implanting ions into the gate electrode to fabricate the MOSFET.

Figure 10:
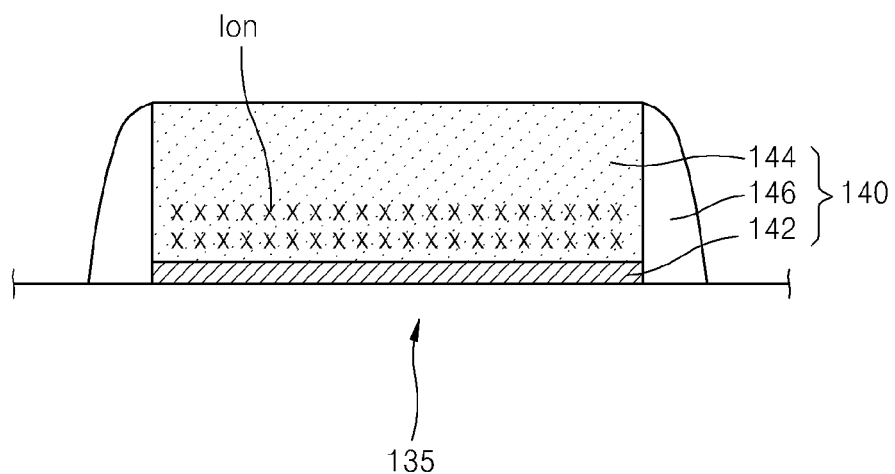
FIG. 10 is a cross-sectional view of an expanded gate structure after ion implantation illustrated in FIG. 9G.

FIG. 10 is a cross-sectional view illustrating an expanded gate structure after the ion implantation shown in FIG. 9G.

Referring to FIG. 10, ions may be implanted to be adjacent to the dielectric layer 142. As described above, when the ions are implanted to be adjacent to the dielectric layer 142, a difference between the work functions of the gate electrode 144 and the semiconductor material of the channel region 135 may be increased, and accordingly, the threshold voltage may be increased.

In addition, the ion implantation is not limited to the portion adjacent to the dielectric layer 142. For example, the ions may be implanted throughout substantially the entire gate electrode 144.

FIGS. 11A through 11D are cross-sectional views illustrating example processes of manufacturing the MOSFET 100*b* of FIG. 5.

Figure 11A:
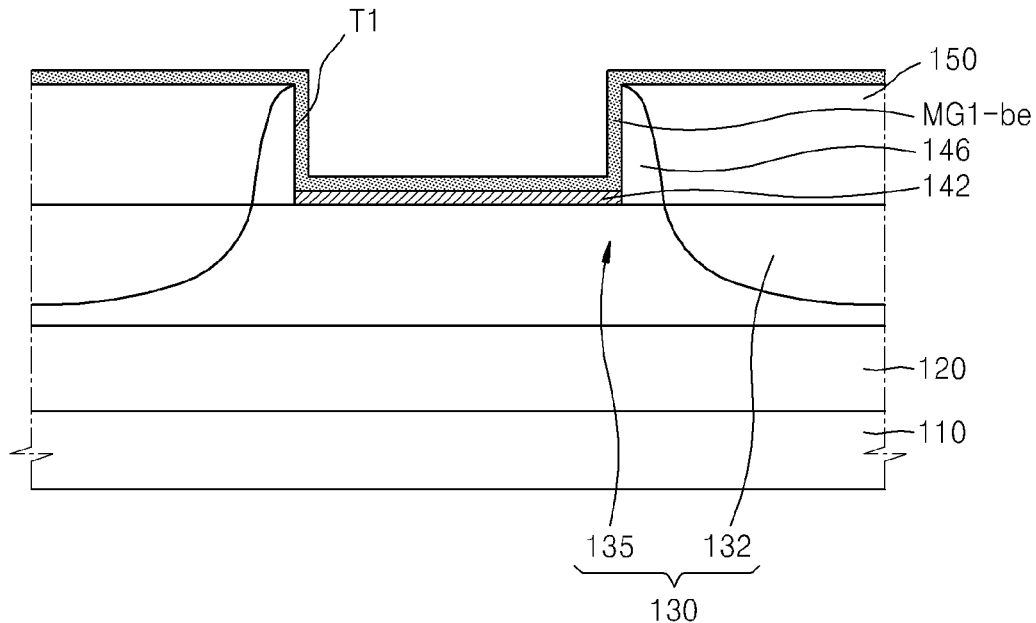
FIGS. 11A through 11D are cross-sectional views illustrating processes of manufacturing the MOSFET of FIG. 5.

Referring to FIG. 11A, after removing the dummy gate electrode 148 as shown in FIG. 9E, a pre-first metal layer MG1-*be* is formed. The pre-first metal layer MG1-*be* is a layer in which the ion implantation is performed, and thus, may be or include a metal, a work function thereof may be increased by the ion implantation. For example, the pre-first metal layer MG1-*be* may be or include TiN. However, the pre-first metal layer MG1-*be* is not limited to the TiN layer. For example, the pre-first metal layer MG1-*be* may be or include various metals described with reference to MOSFET 100 of FIG. 1.

The pre-first metal layer MG1-*be* may be substantially uniformly formed in the trench T1 and on the insulating layer 150 to a thickness of about 5 nm or less. The pre-first metal layer MG1-*be* may be formed by a deposition method such as PVD or CVD. If necessary, the pre-first metal layer MG1-*be* may be formed by a plating method that uses a seed layer. In addition, if the first metal layer MG1 has the multi-layered structure as in the MOSFET 100*c* of FIG. 6, the layers included in the multi-layered structure may be sequentially formed by the deposition method in the example process.

Figure 11B:
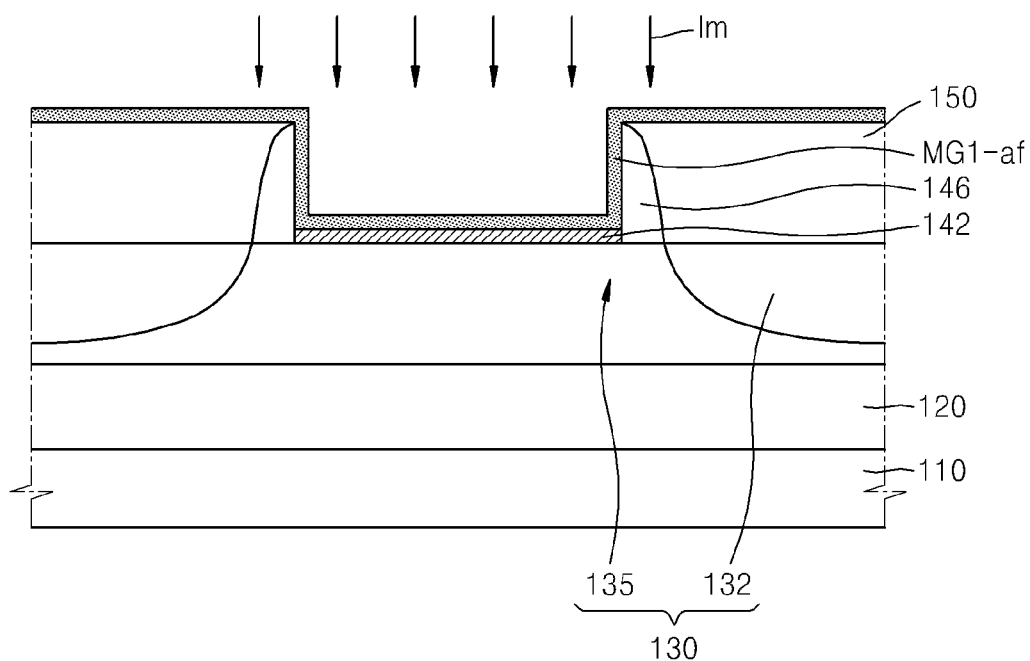

Referring to FIG. 11B, ions are implanted in the pre-first metal layer MG1-*be* as denoted by arrows Im. The ions may be, for example, N ions, O ions, Cl ions, Br ions, or the like. In the MOSFET 100*b* of FIG. 5, the pre-first metal layer MG1-*be* may be or include TiN, and in this case, N ions may be implanted.

By implanting ions in the pre-first metal layer MG1-*be*, a first metal layer MG1-*af*, the work function of which has increased, may be formed. In addition, since the ions are implanted directly into the pre-first metal layer MG1-*be* that is adjacent to the dielectric layer 142, the capacity to increase the work function may be enhanced. That is, as described above with referent to FIG. 3, if the ions are implanted via another material layer, a loss of ions may occur while passing through the other material layer, or characteristics of the ions might be changed, and thus, the capacity to increase the work function may be degraded. However, according to the example embodiment, the ions are directly implanted into the pre-first metal layer MG1-*be*, the work function of the first metal layer MG1-*af* may be increased largely.

Figure 11C:
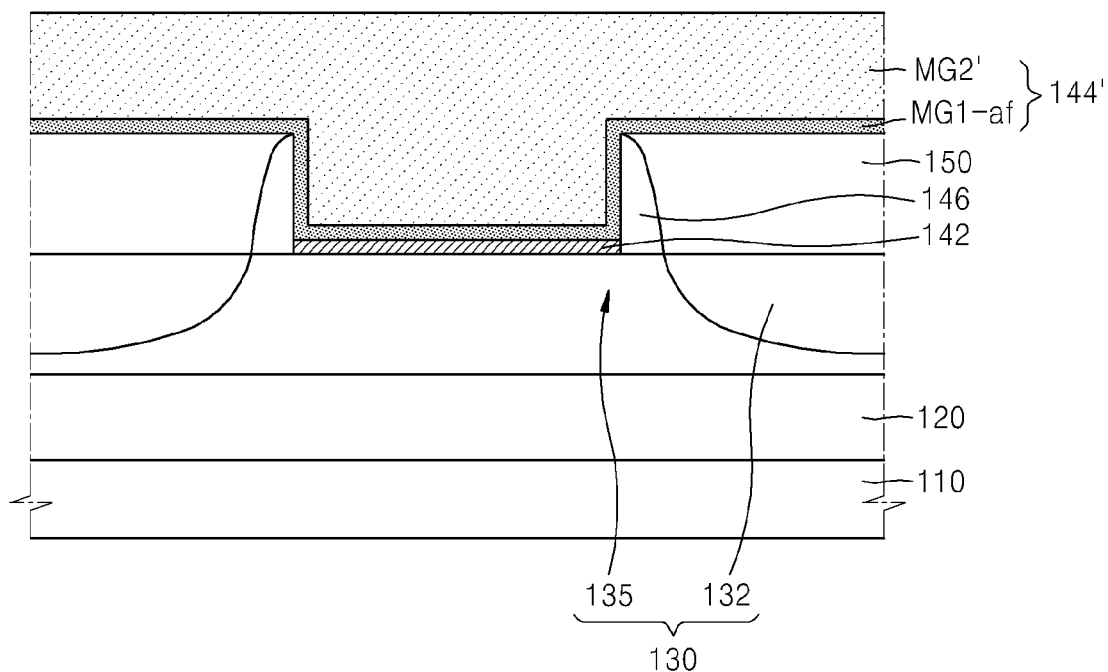

Referring to FIG. 11C, after forming the first metal layer MG1-*af* through ion implantation, a second metal layer MG2' is formed on the first metal layer MG1-*af*. The second metal layer MG2' may be or include a metal having an excellent gap fill property and easily removed by a polishing process. For example, the second metal layer MG2' may be or include W, Al, Ti, TiN, or the like.

In addition, as described above with reference to the MOSFET 100*b* of FIG. 5, the ions may not be implanted into the second metal layer MG2'. However, the one or more example embodiments are not limited thereto.

Figure 11D:
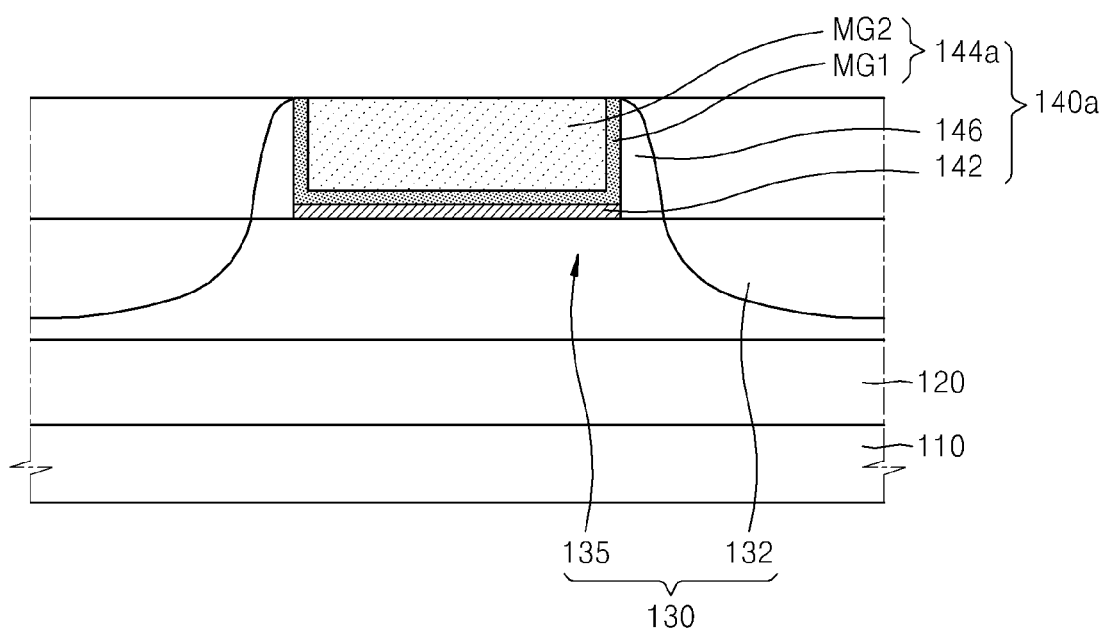

Referring to FIG. 11D, after forming the second metal layer MG2', the second metal layer MG2' is planarized by the CMP process so as to expose the upper surface of the insulating layer 150, and thus, the first metal layer MG1 and the second metal layer MG2 are formed in the trench T1. If an entire thickness of the gate electrode 144 is about 25 nm to about 30 nm, the first metal layer MG1 may have a thickness of about 5 nm and the second metal layer MG2 may have a thickness of about 20 nm to about 25 nm.

After that, the insulating layer 150 is removed, the MOSFET 100*b* of FIG. 5 may be formed. If necessary, the insulating layer 150 may not be removed, and in this case, contacts penetrating the insulating layer 150 may be formed.

Figure 12:
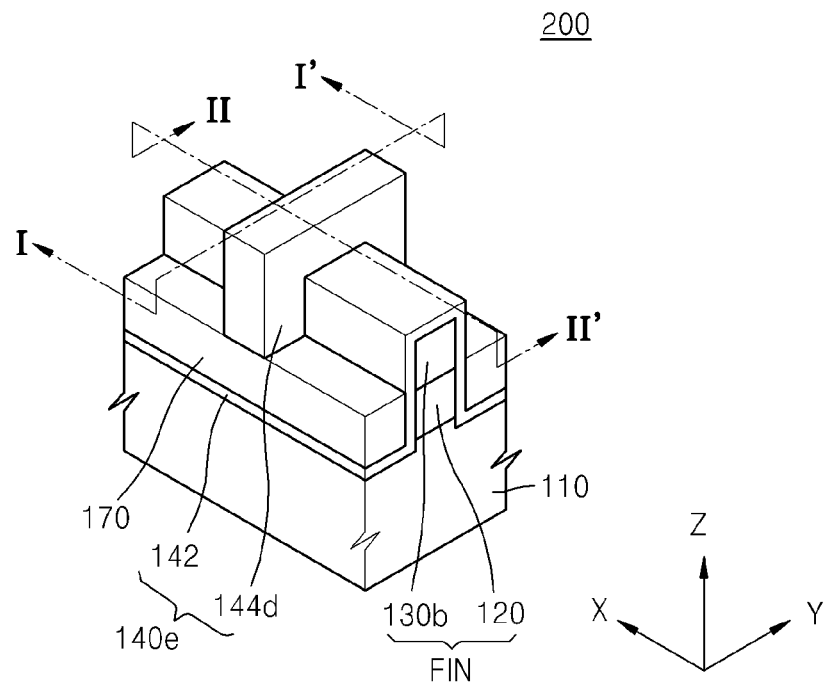
FIG. 12 is a perspective view of a FIN-type MOSFET according to an example embodiment.
Figure 13A:
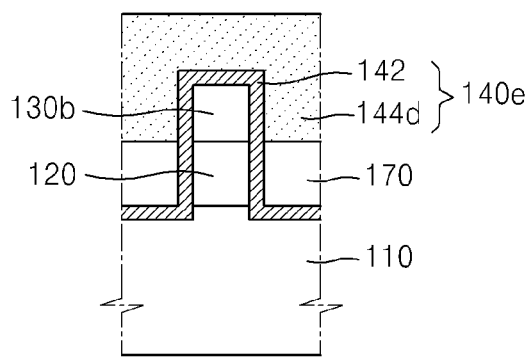
FIGS. 13A and 13B are cross-sectional views of the FIN-type MOSFET taken along lines I-I' and II-II' of FIG. 12.
Figure 13B:
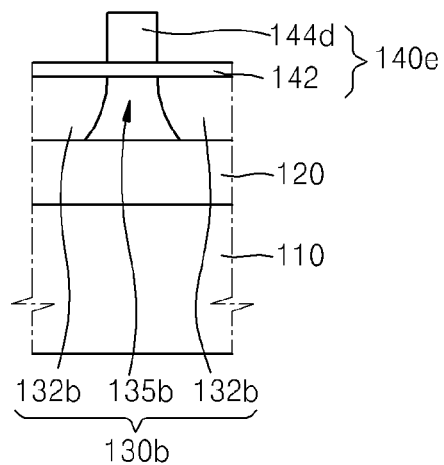

FIG. 12 is a perspective view of a MOSFET 200 of a FIN-type according to an example embodiment, and FIGS. 13A and 13B are cross-sectional views of the MOSFET 200 taken along line I-I' and line II-II' of FIG. 12.

Referring to FIGS. 12, 13A, and 13B, the MOSFET 200 of the example embodiment may have a FIN-type structure. The MOSFET 200 may include the substrate 110, a first insulating layer 142, a second insulating layer 170, an active fin FIN, and a gate electrode 144*d*.

The substrate 110 may be a silicon substrate like in the MOSFET 100 of FIG. 1. For example, the substrate 110 may include one of silicon-on-insulator (SOI), silicon-on-sapphire, germanium, silicon-germanium, and gallium-arsenide.

The active fin FIN is connected to the substrate 110, and may protrude from the substrate 110 in a perpendicular direction (z direction) and extend in a first direction (x direction). The above active fin FIN may have the buffer layer 120 and a semiconductor layer 130*b*. The buffer layer 120 and the semiconductor layer 130*b* may be or include the material layers described with reference to the MOSFET 100 of FIG. 1. For example, the buffer layer 120 may have a triple-layered structure including GaAs/InP/InAlAs. Also, the semiconductor layer 130*b* may be or include a group III-V compound, for example, InAS or $In_{1-x}Ga_xAs$. Here, x is a value between 0 and 1, and in the MOSFET 200 of the example embodiment, x may be 0.47.

In addition, as shown in FIG. 13B, the semiconductor layer 130*b* may include a channel region 135*b* and source and drain regions 132*b*. The channel region 135*b* may be adjacent to a lower portion of the gate electrode 144*d*, and the source and drain regions 132*b* may be on the semiconductor layer 130*b* at opposite sides of the channel region 135*b*. The source and drain regions 132*b* may be formed by implanting impurity ions into the semiconductor layer 130*b* by using the gate structure 140*e* as a mask, as described above with reference to the MOSFET 100 of FIG. 1.

The first and second insulating layers 142 and 170 may be or include an insulating material. For example, the insulating material may include one of the oxide layer, the nitride layer, or the oxynitride layer.

The first insulating layer 142 may be disposed on the active fin FIN and the substrate 110. The first insulating layer 142 is disposed between the active fin FIN and the gate electrode 144*d* as a dielectric layer in the gate structure 140*e*. Since the first insulating layer 142 functions as the dielectric layer in the gate structure 140*e*, the first insulating layer 142 may be or include a high-k dielectric material. For example, the first insulating layer 142 may be or include various dielectric materials described above with reference to FIG. 1 to a thickness of 3 nm or less.

The second insulating layer 170 may be on the first insulating layer 142 between the active fins FIN to have a desired, or alternatively predetermined height. Since the second insulating layer 170 is between a plurality of active fins FIN, the second insulating layer 170 may be a device isolating layer separating the active fins FIN electrically from each other. For example, although not shown in the drawings, the plurality of active fins FIN may extend in the first direction (x direction) and may be arranged with desired, or alternatively predetermined intervals therebetween in a second direction (y direction) in which the gate electrode 144*d* extends. The second insulating layer 170 is disposed between the plurality of active fins FIN as the device isolation layer.

The gate electrode 144*d* may be on upper portions of the first and second insulating layers 142 and 170. The gate electrode 144*d* may have a structure surrounding the active fins FIN. That is, the active fins FIN may be disposed in the gate electrode 144*d*. As shown in FIGS. 12, 13A, and 13B, the gate electrode 144*d* may cross the active fin FIN to extend in the second direction (y direction). Also, the gate electrode 144*d* may cross the plurality of active fins FIN that are arranged in the second direction.

According to at least one example embodiment, the gate electrode 144*d* is or includes a metal in which ions are implanted. For example, the gate electrode 144*d* may be or include a metal having a relatively high work function, and may include ions that are implanted to increase the work function of the metal. The gate electrode 144*d* may be or include a metal such as Re, Ir, W, Al, Ti, TiN, TaN, TiC, or TaC, as described above with reference to FIG. 1. Also, N ions, O ions, Cl ions, Br ions, or the like may be implanted the gate electrode 144*d* to increase the work function.

In addition, although not shown in the drawings, dummy fins (not shown) may be on the substrate 110 in addition to the plurality of active fins FIN. Also, a plurality of the gate electrodes 144*d* may have desired, or alternatively predetermined intervals therebetween in the first direction (x direction) while crossing the active fins FIN and the dummy fins.

Figure 14:
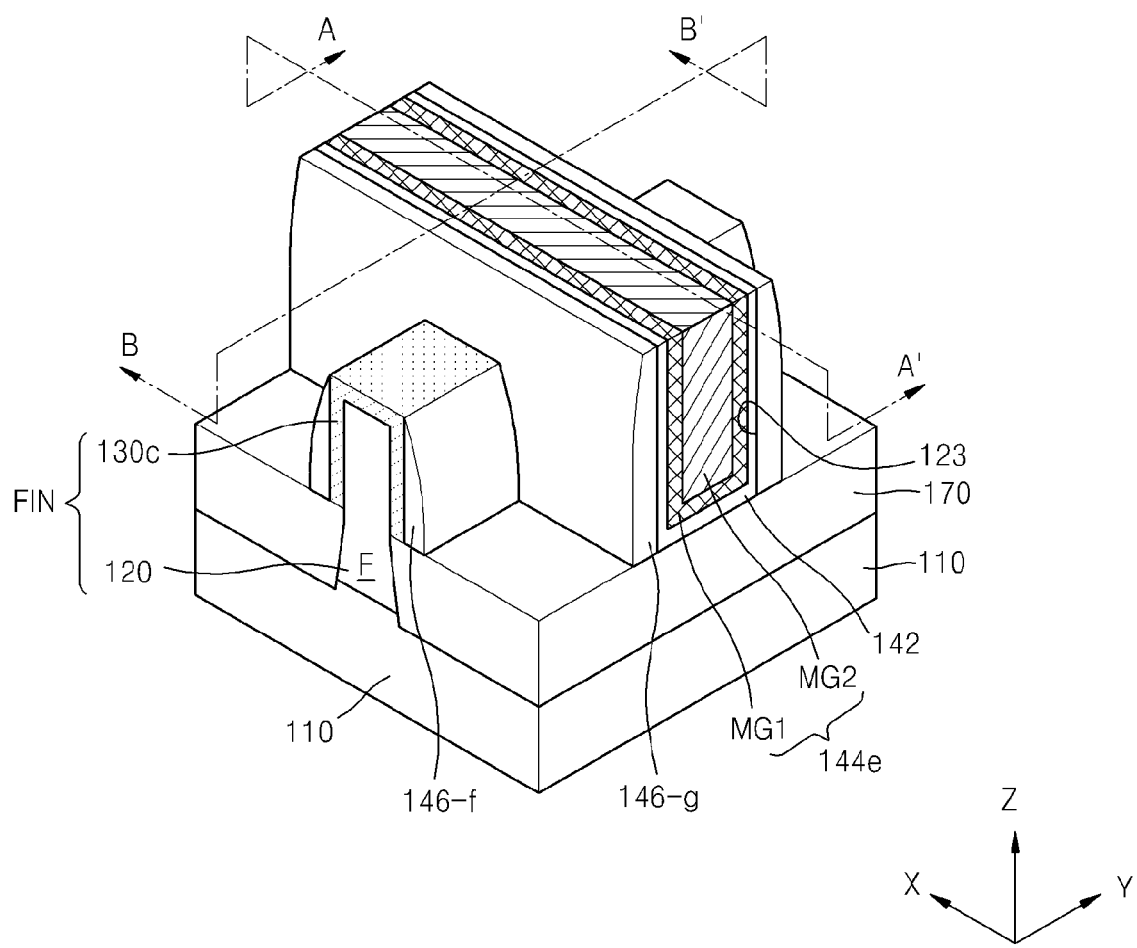
FIG. 14 is a perspective view of a FIN-type MOSFET according to an example embodiment.
Figure 15A:
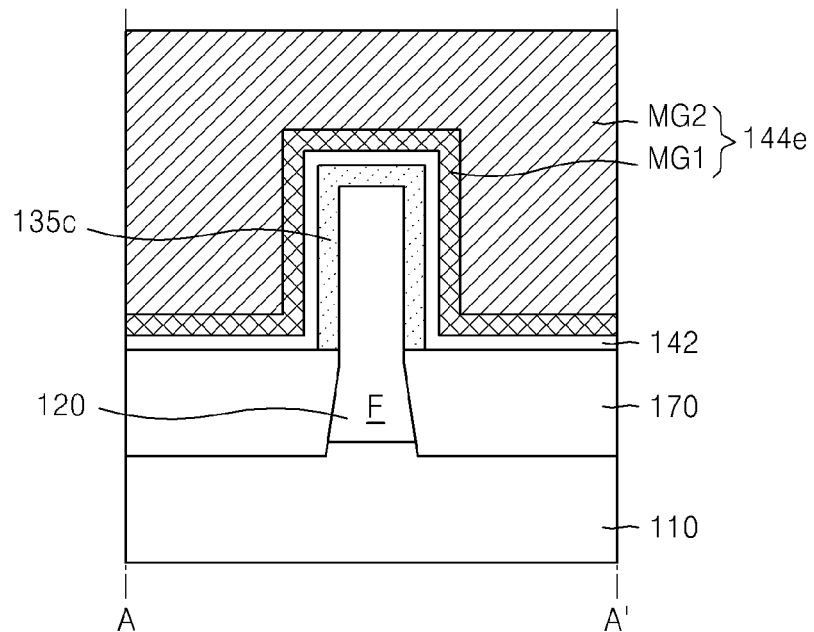
FIGS. 15A and 15B are cross-sectional views of the FIN-type MOSFET taken along lines A-A' and B-B' of FIG. 14.
Figure 15B:
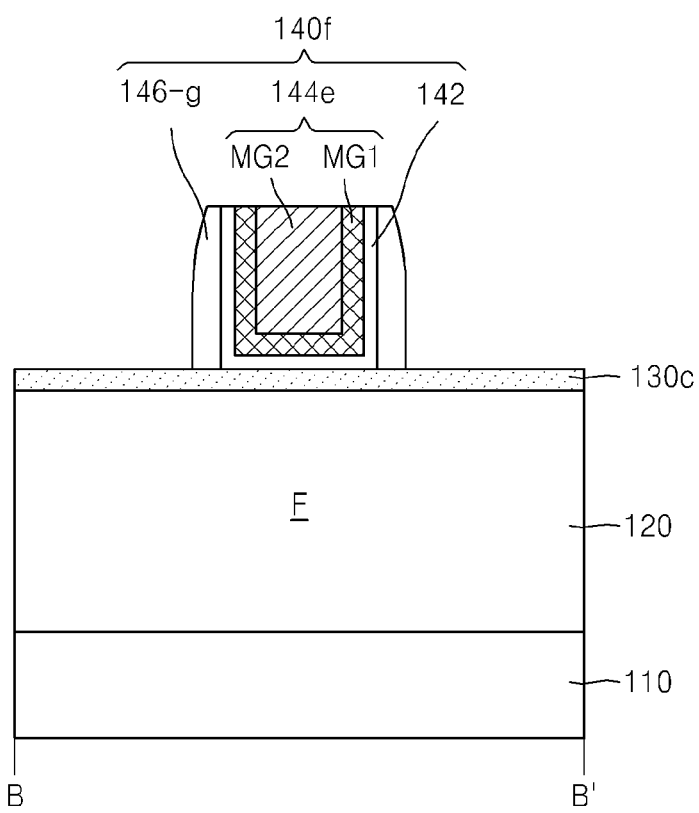

FIG. 14 is a perspective view of a MOSFET of a fin-type according to an example embodiment, and FIGS. 15A and 15B are cross-sectional views of the MOSFET taken along line A-A' and B-B' of FIG. 14.

Referring to FIGS. 14, 15A, and 15B, the MOSFET 200*a* of the example embodiment has a fin-type structure similarly to the MOSFET 200 of FIG. 12, but may have different gate electrode 144*e* and active fins FIN from those of the MOSFET 200. In the MOSFET 200*a* of the example embodiment, the gate electrode 144*e* may include the first metal layer MG1 and the second metal layer MG2.

The first metal layer MG1 and the second metal layer MG2 are the same as those of the MOSFET 100*b* of FIG. 5. That is, the first metal layer MG1 is a layer in which the ions are implanted, and the second metal layer MG2 may be a layer in which the ions are not implanted. For example, the first metal layer MG1 may be based on TiN, and N ions, O ions, Cl ions, Br ions, or the like being implanted into the first metal layer MG1. Also, the first metal layer MG1 may have a multi-layered structure as in the MOSFET 100c of FIG. 6. If the first metal layer MG1 has the multi-layered structure, the first metal layer MG1 may include GaAs/InP/InAlAs layers, and N ions, O ions, Cl ions, Br ions, or the like may be implanted into the first metal layer MG1.

The first metal layer MG1 and the second metal layer MG2 are similar to or the same as the layers of the MOSFET 100b of FIG. 5, except that the first and second metal layers MG1 and MG2 are disposed to cross the active fin FIN while surrounding the active fin FIN.

In the MOSFET 200 of FIG. 12, the first insulating layer 142 and the gate electrode 144d form the gate structure 140e; however, in the MOSFET 200a of the example embodiment, as shown in FIG. 14, the dielectric layer 142, the gate electrode 144e, and a gate spacer 146-g may configure a gate structure 140f. In addition, the dielectric layer 142 may surround only the gate electrode 144e. That is, in the MOSFET 200a of the example embodiment, the dielectric layer 142 may not be formed on the substrate 110. In addition, the gate spacer 146-g may surround opposite side walls of the dielectric layer 142.

The active fin FIN includes the buffer layer 120 and a semiconductor layer 130c; however, unlike the MOSFET 200 of FIG. 12, the semiconductor layer 130c may surround an upper portion of the buffer layer 120. In particular, the buffer layer 120 may protrude upward from the substrate 110 and may extend in the second direction (y direction). Also, the semiconductor layer 130c may extend in the second direction while surrounding the upper portion of the buffer layer 120. A second insulating layer 170 may be around a lower portion of the buffer layer 120. The second insulating layer 170 may be directly formed on the substrate 110 without having an intervening first insulating layer, and may be a device isolation layer as in the MOSFET 200 of FIG. 12.

In addition, a fin spacer 146-f may be formed on opposite side walls of the active fin FIN. The fin spacer 146-f may be formed together with the gate spacer 146-g. The fin spacer 146-f and the gate spacer 146-g may be used to remove the dummy gate electrode, which will be described in more detail with reference to FIGS. 18H, 20A and 20B.

Figure 16:
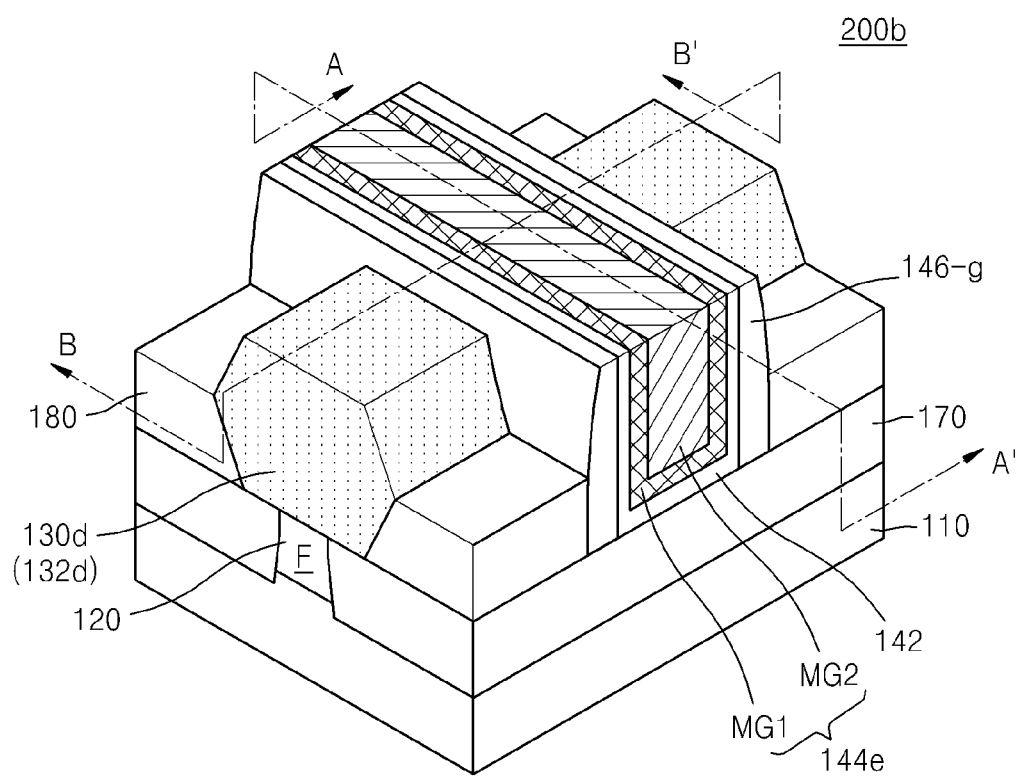
FIG. 16 is a perspective view of a FIN-type MOSFET according to an example embodiment.
Figure 17A:
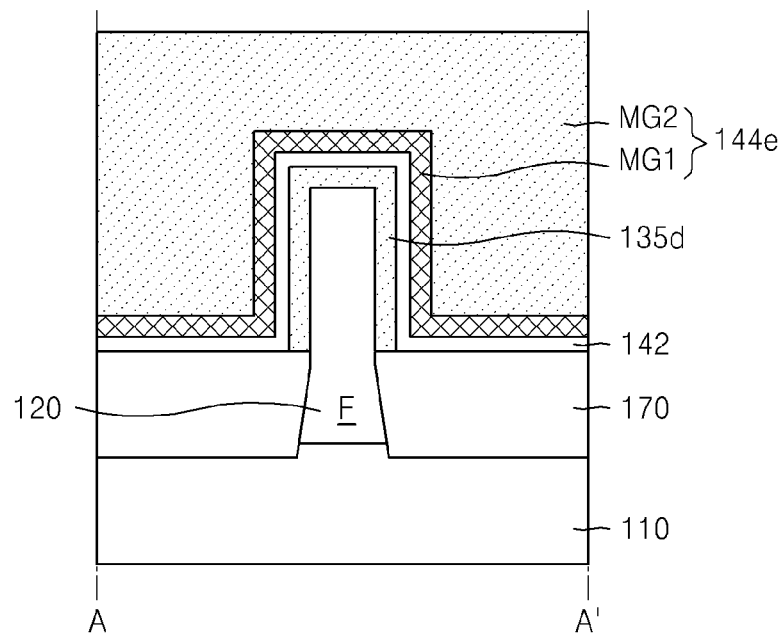
FIGS. 17A and 17B are cross-sectional views of the FIN-type MOSFET taken along lines A-A' and B-B' of FIG. 16.
Figure 17B:
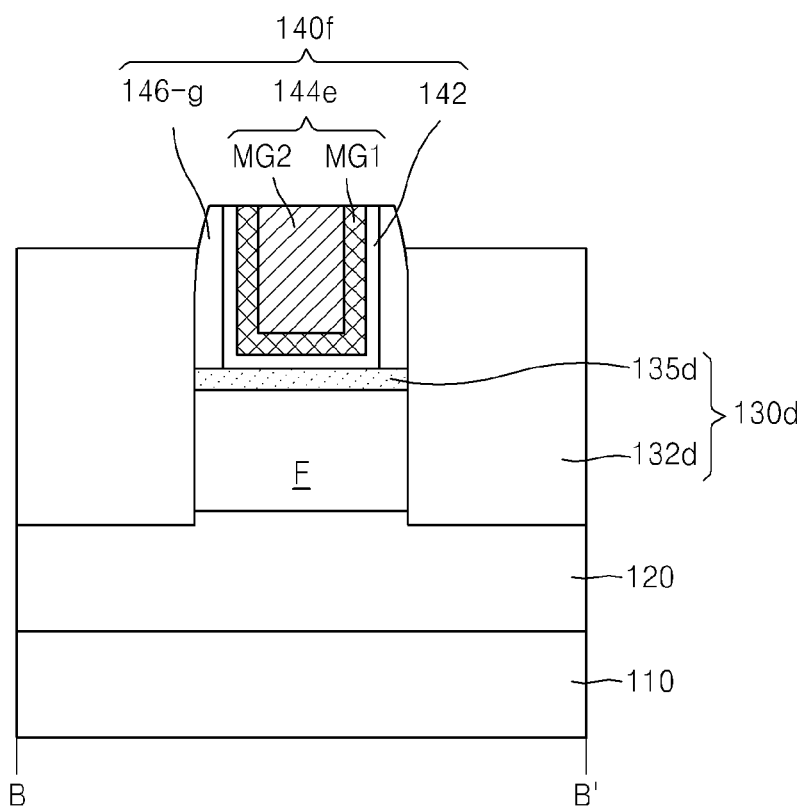

FIG. 16 is a perspective view of a fin-type MOSFET 200b according to an example embodiment, and FIGS. 17A and 17B are cross-sectional views of the fin-type MOSFET 200b taken along line A-A' and line B-B' of FIG. 16.

Referring to FIGS. 16, 17A, and 17B, the MOSFET 200b of the example embodiment may be similar to or the same as the MOSFET 200a of FIG. 14, except for a structure of a semiconductor layer 130d. That is, in the MOSFET 200b of the example embodiment, the semiconductor layer 130d includes a channel region 135d and source and drain regions 132d, and the source and drain regions 132d are on the buffer layer 120 and the second insulating layer 170 at an outer portion of the gate structure 140f. In addition, a size of the source and drain regions 132d may be greater than the size of the buffer layer 120.

The source and drain regions 132d may be formed through regrowth or deposition of the semiconductor layer. When comparing with the MOSFET 200a of FIG. 14, the MOSFET 200b of the example embodiment has the source and drain regions 132d that are formed above the buffer layer 120 with a relatively greater width without covering side surfaces of the buffer layer 120. In addition, as shown in FIG. 17B, a thickness of the source and drain regions 132d is much greater than the thickness of the buffer layer 120. The channel region 135d may be small in thickness to connect the source and drain regions 132d to each other under the gate structure 140f. Also, the channel region 135d may surround the upper portion of the buffer layer 120.

In particular, the source and drain regions 132d may be provided at opposite sides of the gate structure 140f as shown in the drawings. As shown in FIG. 17B, side surfaces of the source and drain regions 132d may contact protruding portion of the buffer layer 120. The source and drain regions 132d may be located in recess portions R1 (refer to FIG. 18K) that are formed in a third insulating layer 180. For example, the source and drain regions 132d may be formed as elevated source and drain, in which upper surfaces of the source and drain regions 132d are located higher than a lower surface of the gate structure 140f. The source and drain regions 132d and the gate structure 140f may be insulated from each other by the gate spacer 146-g. For example, the gate spacer 146-g may include at least one of a nitride layer and an oxynitride layer.

In addition, the third insulating layer 180 that covers the upper surface of the buffer layer 120 may be formed on the side surfaces of the source and drain regions 132d and the side surfaces of the gate structure 140f. The third insulating layer 180 may be, for example, a silicon oxide layer.

In the MOSFET 200b of the example embodiment, the channel regions 135d may be or include a group III-V compound semiconductor. However, since the source and drain regions 132d are formed through the regrowth of semiconductor, the source and drain regions 132d may be or include other semiconductor materials than the group III-V compound semiconductor. Accordingly, the source and drain regions 132d may be or include different semiconductor material from the material of the source and drain region based on the group III-V compound semiconductor described above, and doped with different ions from the above source and drain regions. For example, the source and drain regions 132d may be formed by implanting trivalent ions such as B or pentavalent ions such as P or As into a silicon layer.

If the MOSFET is a PMOS, the source and drain regions 132d may be compressive stress pattern. For example, the compressive stress pattern, for example, an SiGe pattern, may have a material, a lattice constant thereof is relatively greater than the lattice constant of silicon. The compressive stress pattern applies a compressive stress to a protruding portion of the channel region 135d and the buffer layer 120 to improve mobility of charges in the channel region 135d. Unlike the above, if the MOSFET is an NMOS, the source and drain regions 132d may be or include the same material as the substrate 110. For example, if the substrate 110 is a silicon substrate, the source and drain regions 132d may be or include silicon.

In addition, in the MOSFET 200b of the example embodiment, the source and drain regions 132d may be formed based on the group III-V compound semiconductor, and by doping the group III-V compound semiconductor with various ions as described above with reference to the MOSFET 100 of FIG. 1.

Also, in the MOSFET 200b of the example embodiment, the gate electrode 144e may include the first metal layer MG1 and the second metal layer MG2 like in the MOSFET 200a of FIG. 14. In addition, when ions are implanted into the first metal layer MG1, the work function of the gate electrode 144e is increased, and accordingly, the threshold voltage of the MOSFET 200b is also increased.

FIGS. 18A through 18K are perspective views illustrating processes of manufacturing the MOSFET 200b of FIG. 16, and FIGS. 19A and 19B, 20A and 20B, 21A and 21B, 22A and 22B, and 23A and 23B are cross-sectional views of the MOSFET 200b respectively taken along lines A-A' and B-B' of FIGS. 18G, 18H, 18I, 18J, and 18K.

Figure 18A:
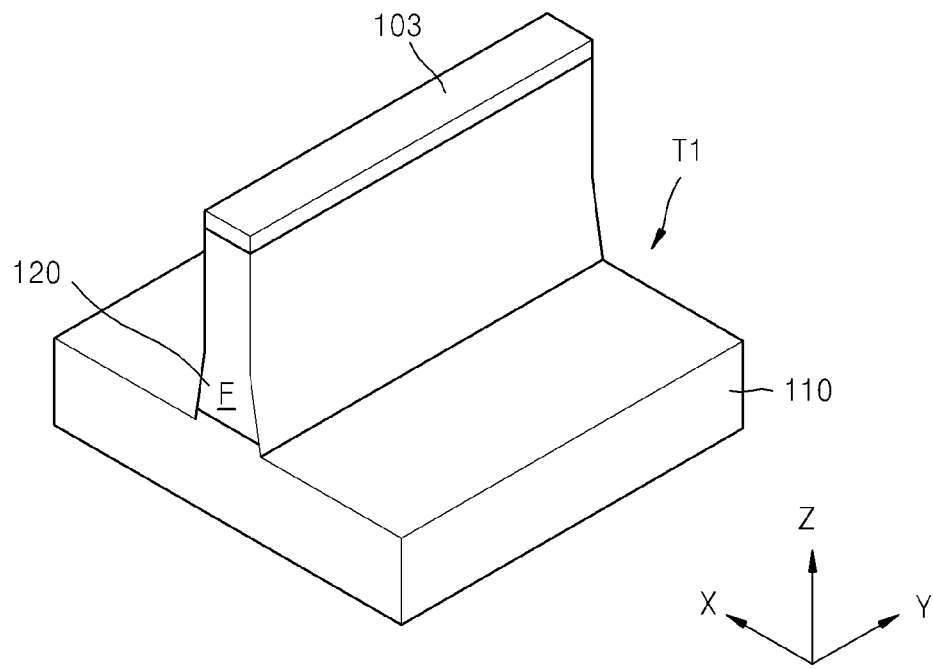
FIG. 18A through 18K are perspective views illustrating the processes of manufacturing the MOSFET of FIG. 16.

Referring to FIG. 18A, the buffer layer 120 is formed on the substrate 110, and the buffer layer 120 and the substrate 110 are partially removed to form a first trench T1 for forming a device isolation layer. The substrate 110 and the buffer layer 120 may be or include the material in the structure described with reference to the MOSFET of FIG. 1. The first trench T1 may be formed by forming a first mask pattern 103 on the buffer layer 120 and performing an etching process by using the first mask pattern 103 as an etching mask. The first mask pattern 103 may be formed as a line extending in the second direction (y direction). Through the etching process, a fin structure F extending in the second direction may be obtained. The first mask pattern 103 may be or include at least one of the silicon oxide layer, the silicon nitride layer, and the silicon oxynitride layer.

According to another example embodiment, the buffer layer 120 and the semiconductor layer 130 are sequentially formed on the substrate 110, and then, the buffer layer 120, the semiconductor layer 130, and the substrate 110 may be partially removed to form the fin structure F. In this structure, an additional semiconductor layer 130d' shown in FIG. 18D may not be necessary. Also, in a final structure, a fin structure formed under the gate structure 140f may be similar to or the same as a fin structure formed under the gate structure 140e in the MOSFET 200 of FIG. 12.

Figure 18B:
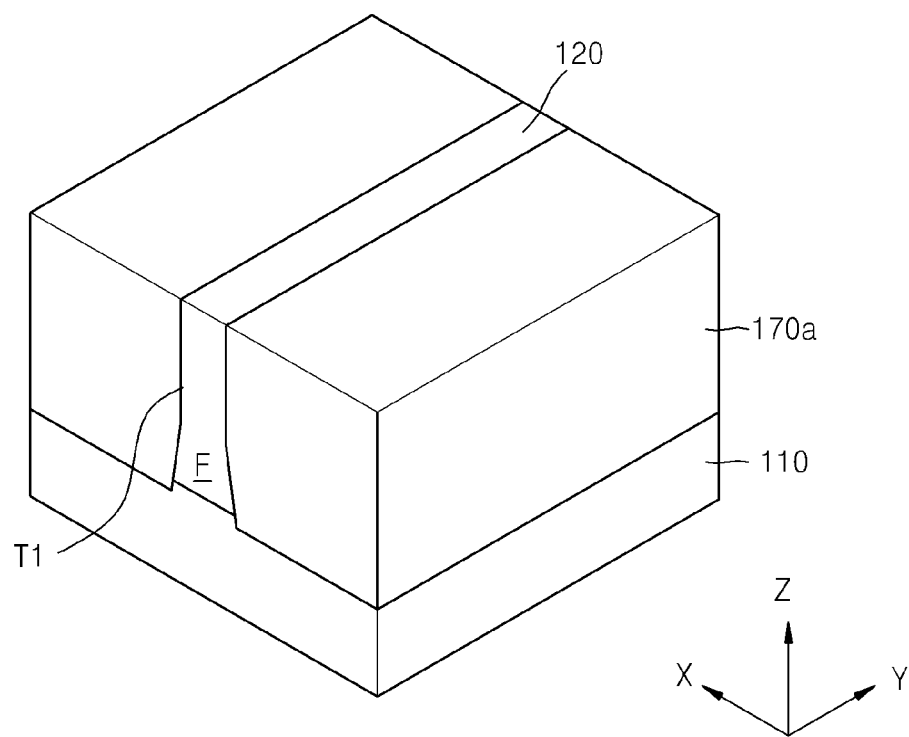
Figure 18C:
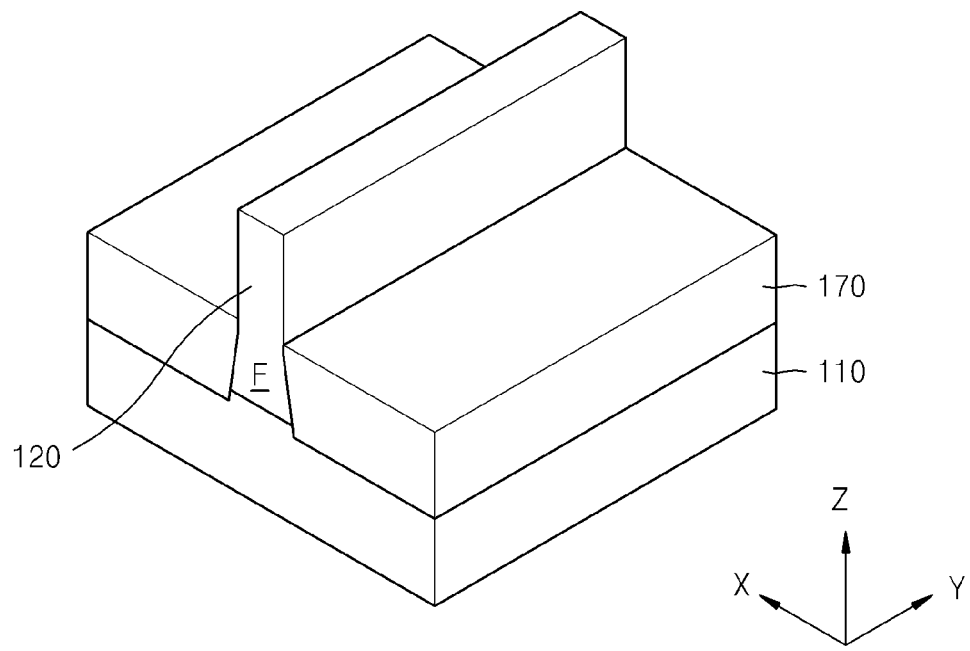

Referring to FIGS. 18B and 18C, a second insulating layer 170a filling the first trench T1 may be formed. In the MOSFET 200 of FIG. 12, the first insulating layer 142 is disposed between the substrate 110 and the second insulating layer 170; however, in the example embodiment, the dielectric layer 142 is between the gate structure 140f and the substrate 110 later, and the first insulating layer 142 of FIG. 12 between the substrate 110 and the second insulating layer 170 may not exist. The second insulating layer 170a may be or include at least one of the silicon oxide, the silicon nitride, and the silicon oxynitride.

An upper portion of the second insulating layer 170a is recessed to expose an upper portion of the fin structure F. The above recess process may include a selective etching process. The first mask pattern 103 may be removed before forming the second insulating layer 170a, or after performing the recess process. The remaining second insulating layer 170 after the recess process may cover the upper surface of the substrate 110 or lower side surfaces of the buffer layer 120.

Figure 18D:
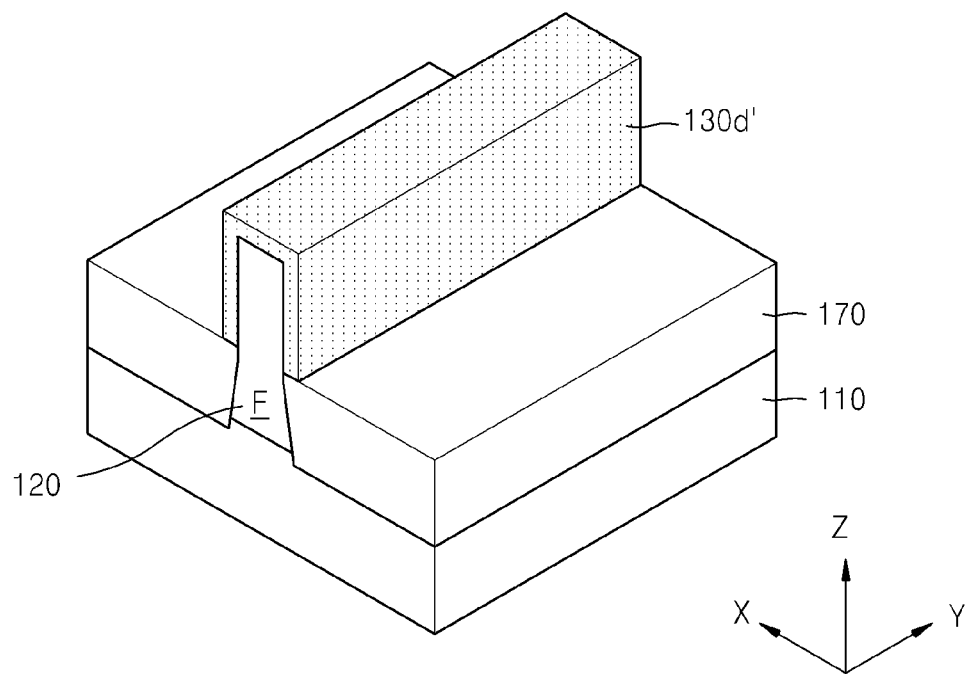

Referring to FIG. 18D, a semiconductor layer 130d' may be on the fin structure F that is exposed above the second insulating layer 170 due to the recess process. The semiconductor layer 130d' may be formed along a line extending along the second direction (y direction). The semiconductor layer 130d' may cover an upper surface and side walls of the exposed fin structure F, and may contact an upper surface of the second insulating layer 170.

The semiconductor layer 130d' may be or include a group III-V compound semiconductor. For example, the semiconductor layer 130d' may be formed by an epitaxial process after forming a seed layer on the fin structure F. Otherwise, according to another example embodiment, the semiconductor layer 130d' may be formed by processes of depositing and patterning the group III-V compound semiconductor material. The semiconductor layer 130d' may be or include the materials described with reference to the MOSFET 100 of FIG. 1. The semiconductor layer 130d' may not be doped with impurity ions. However, one or more example embodiments are not limited thereto, for example, the semiconductor layer 130d' may be doped with a fine amount of impurity ions.

Figure 18E:
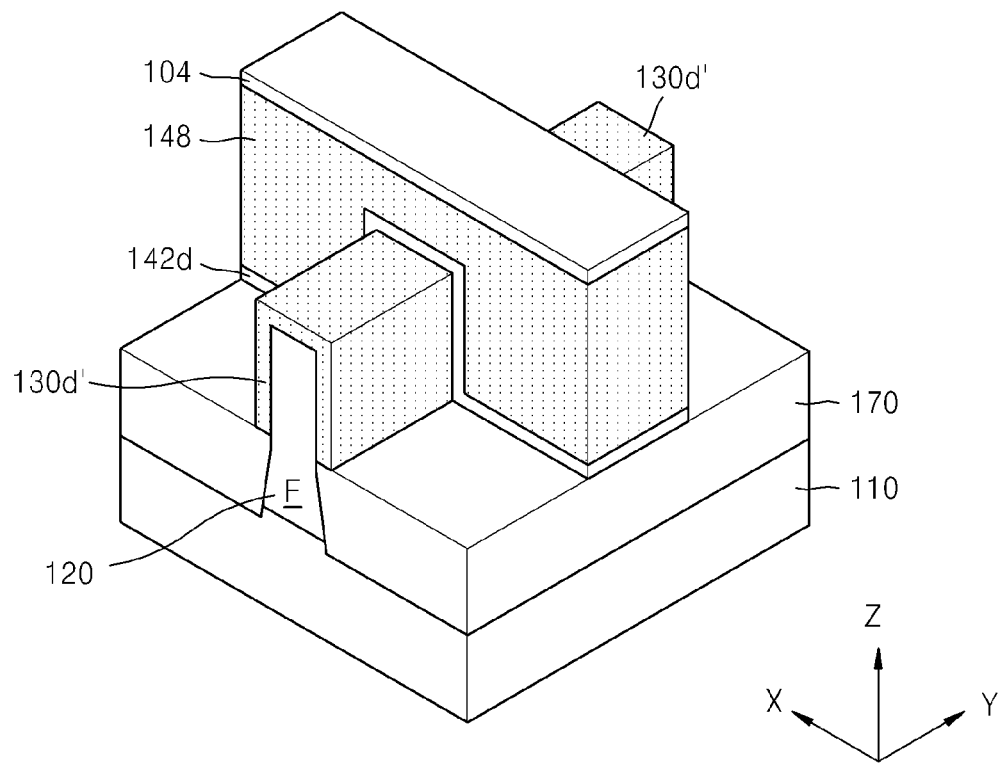

Referring to FIG. 18E, a dummy dielectric layer 142d and the dummy gate electrode 148 that cross the fin structure F and extend in the first direction (x direction) may be formed. The dummy dielectric layer 142d and the dummy gate electrode 148 may extend along the upper surface and the side walls of the semiconductor layer 130d'. For example, the dummy dielectric layer 142d and the dummy gate electrode 148 may be obtained by forming a dielectric layer and a gate electrode material on a resultant of the substrate 110 on which the semiconductor layer 130d' is formed, and then, performing an etching process by using a second mask pattern 104 as an etching mask. The etching process may include a plurality of dry and/or wet etching processes. In addition, the dummy dielectric layer 142d may be or include a silicon oxide layer, and the dummy gate electrode 148 may be or include polysilicon.

Figure 18F:
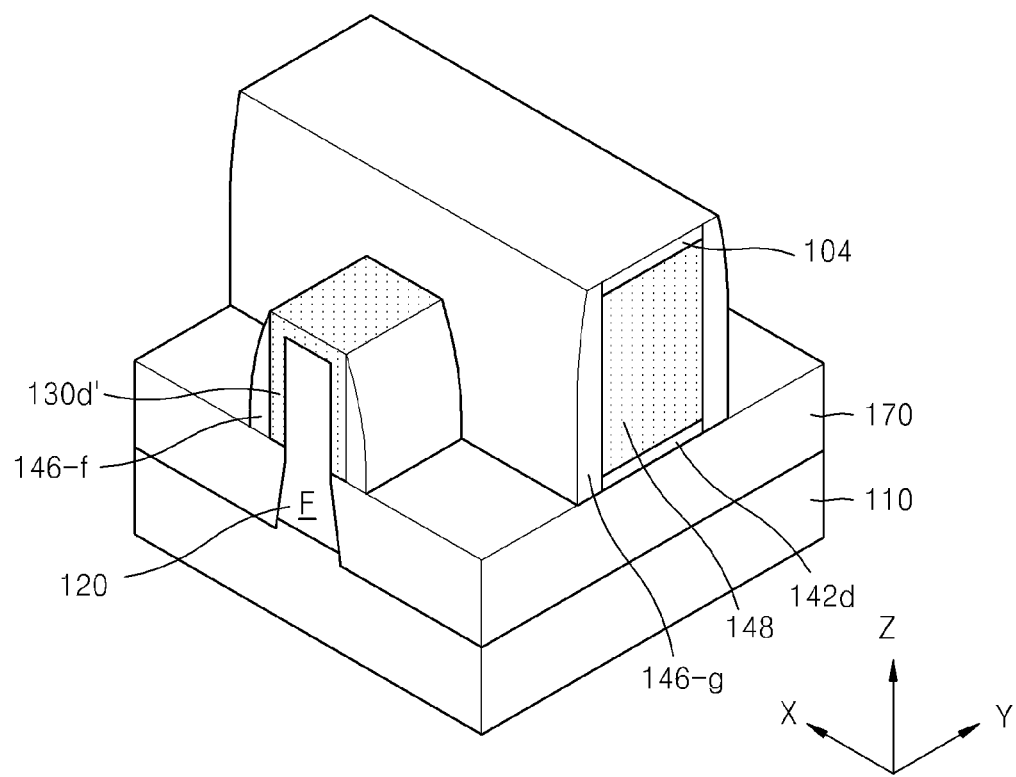

Referring to FIG. 18F, the spacers 146 may be on the side walls of the dummy gate electrode 148 and the semiconductor layer 130d'. That is, the spacers 146 may be formed by forming a dielectric layer covering a resultant of the substrate 110 on which the dummy gate electrode 148 is formed, and performing an etching process having high straightness, for example, an anisotropic etching and/or an etch-back process. The spacers 146 may expose the upper surfaces of the semiconductor layer 130d' and the second mask pattern 104. The spacers 146 may be or include silicon nitride or silicon oxynitride. Also, the spacers 146 may include the gate spacer 146-g formed on the side walls of the dummy gate electrode 148 and the fin spacer 146-f formed on the side walls of the semiconductor layer 130d'.

Figure 18G:
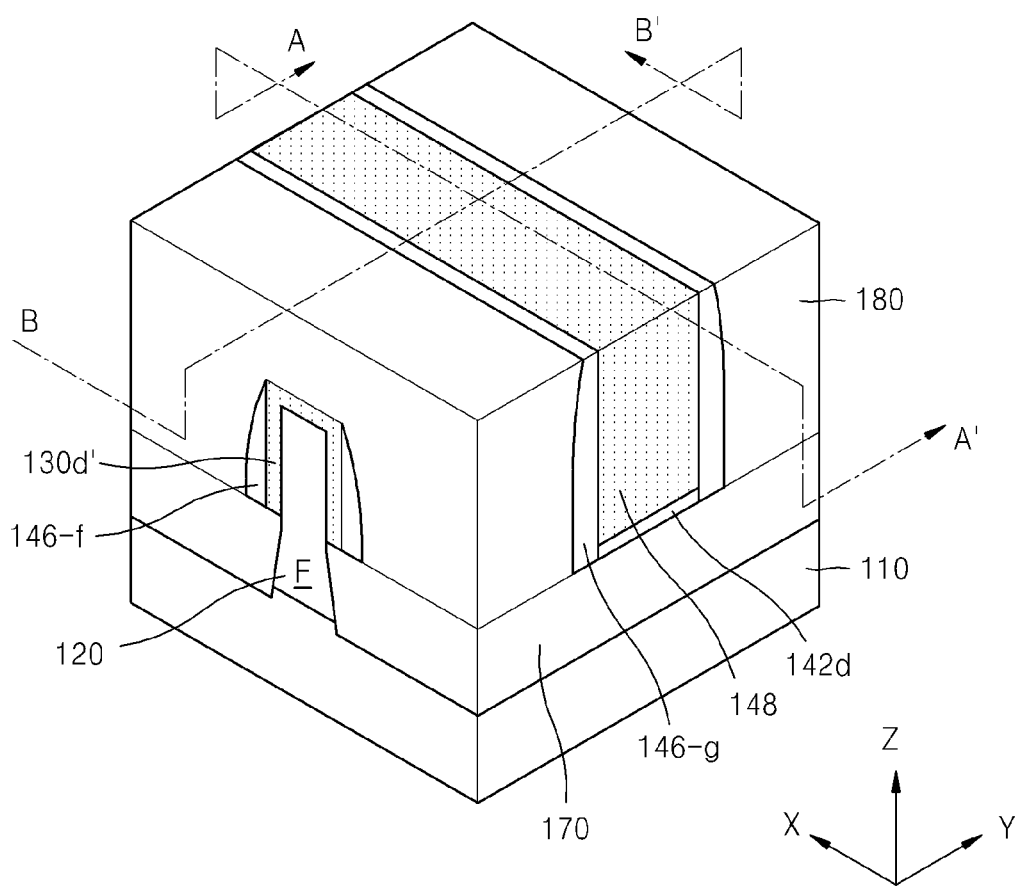
Figure 19A:
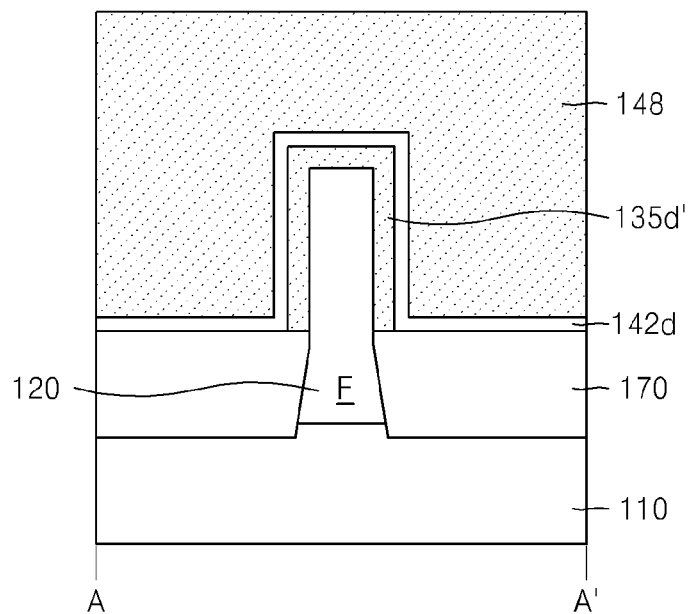
FIGS. 19A and 19B, 20A and 20B, 21A and 21B, 22A and 22B, and 23A and 23B are cross-sectional views of the MOSFETs taken along lines A-A' and B-B' of FIGS. 18G, 18H, 18I, 18J, and 18K, respectively.
Figure 19B:
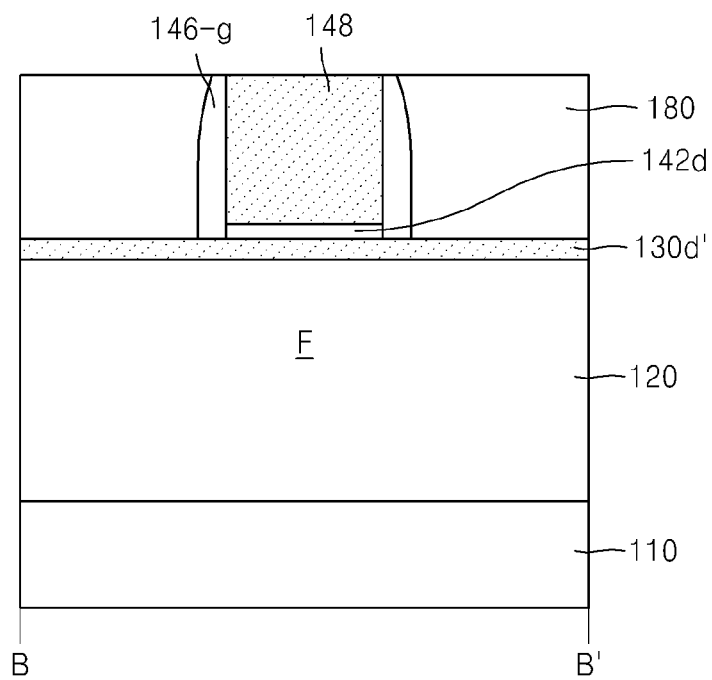

Referring to FIGS. 18G, 19A, and 19B, a third insulating layer 180 may be located on a resultant where the spacers 146 are formed. For example, the third insulating layer 180 may be formed as a silicon oxide layer. The third insulating layer 180 may be planarized by the CMP process until the upper surface of the dummy gate electrode 148 is exposed. Then, the second mask pattern 104 is removed, and the upper surface of the dummy gate 148 may be exposed.

Figure 18H:
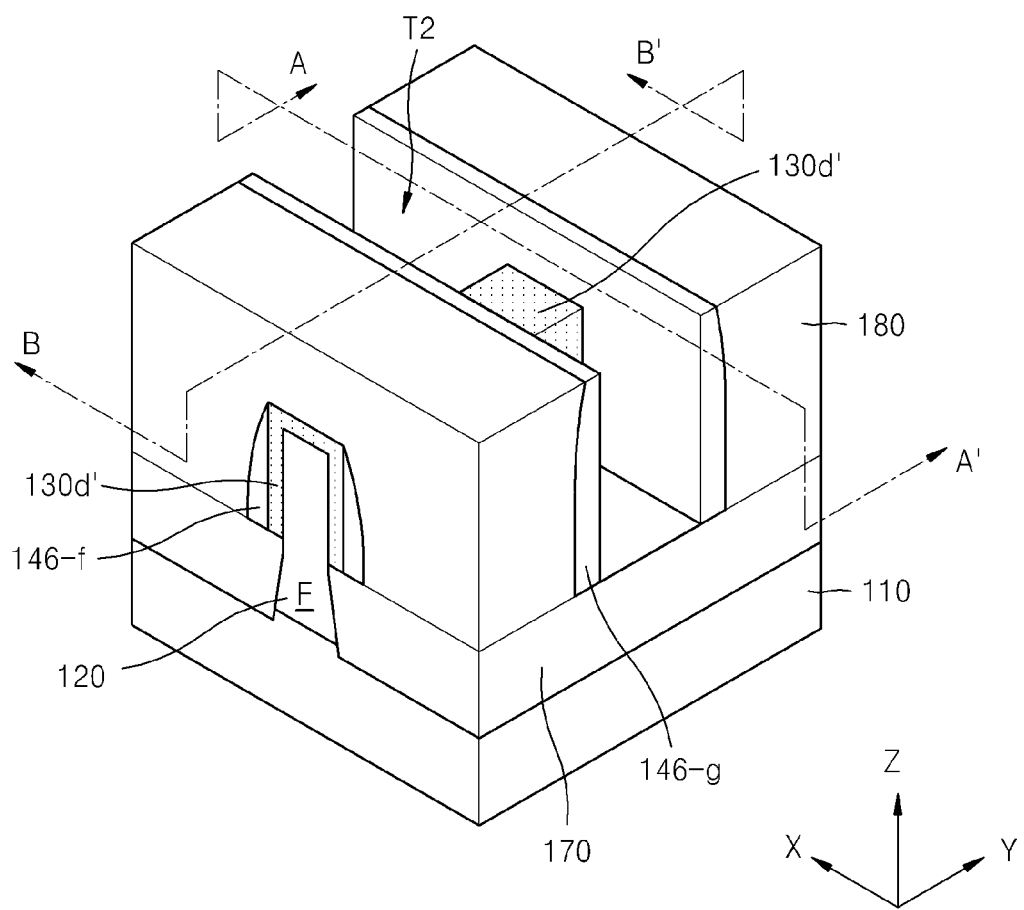
Figure 20A:
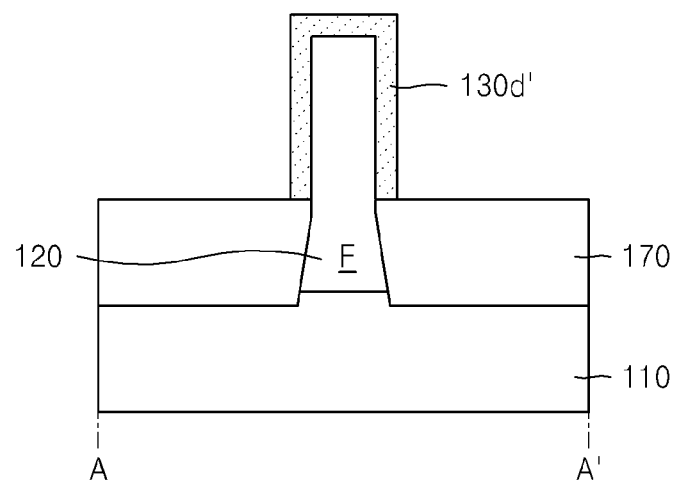
Figure 20B:
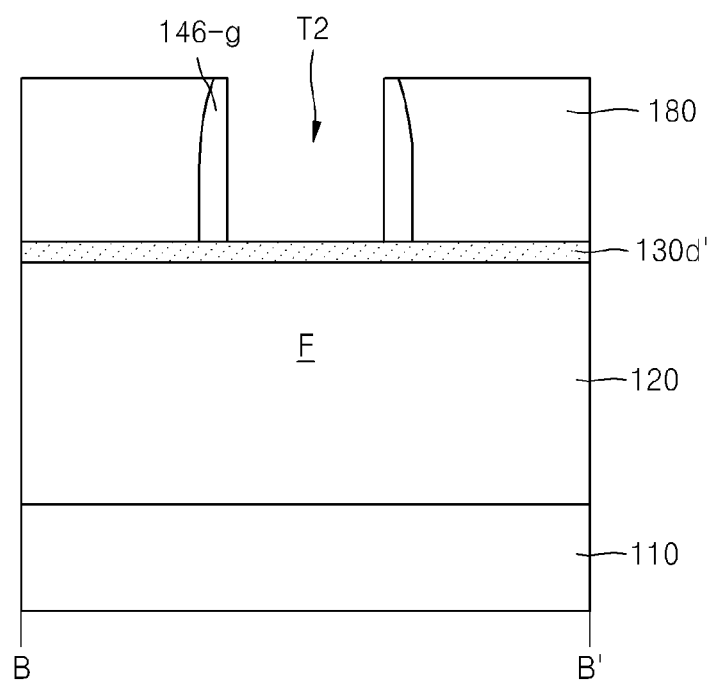

Referring to FIGS. 18H, 20A, and 20B, the dummy dielectric layer 142d and the dummy gate electrode 148 may be removed. By removing the dummy dielectric layer 142d and the dummy gate electrode 148, a second trench T2 exposing the semiconductor layer 130d' may be formed. The dummy electric layer 142d and the dummy gate electrode 148 may be removed by a plurality of selective etching processes. For example, the dummy gate electrode 148 may be removed by a first etching process, and then, the dummy dielectric layer 142d may be removed by a second etching process.

Figure 18I:
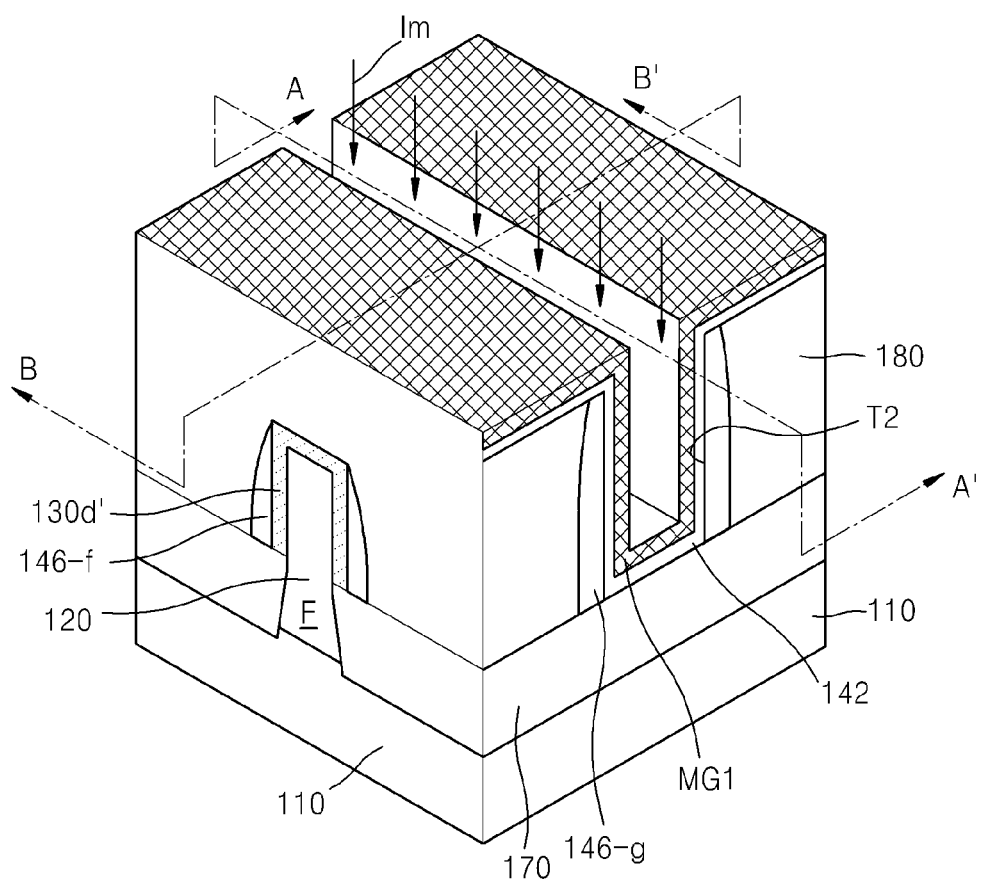
Figure 21A:
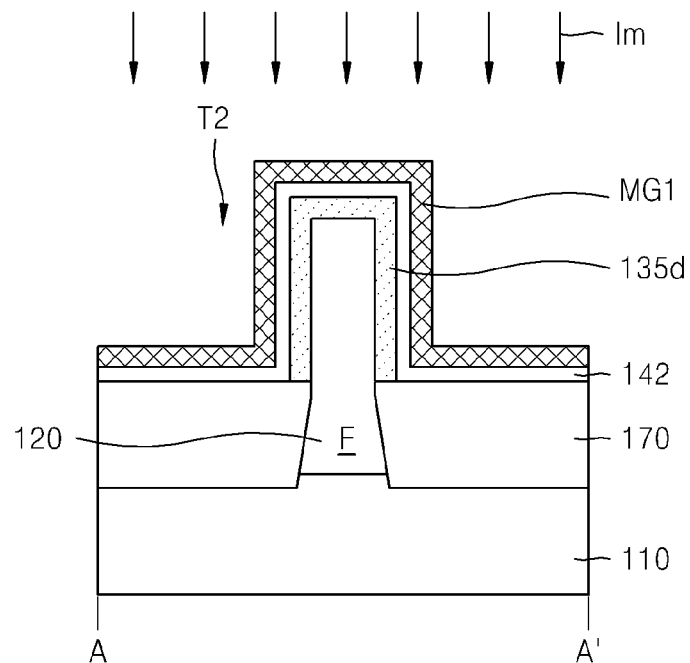
Figure 21B:
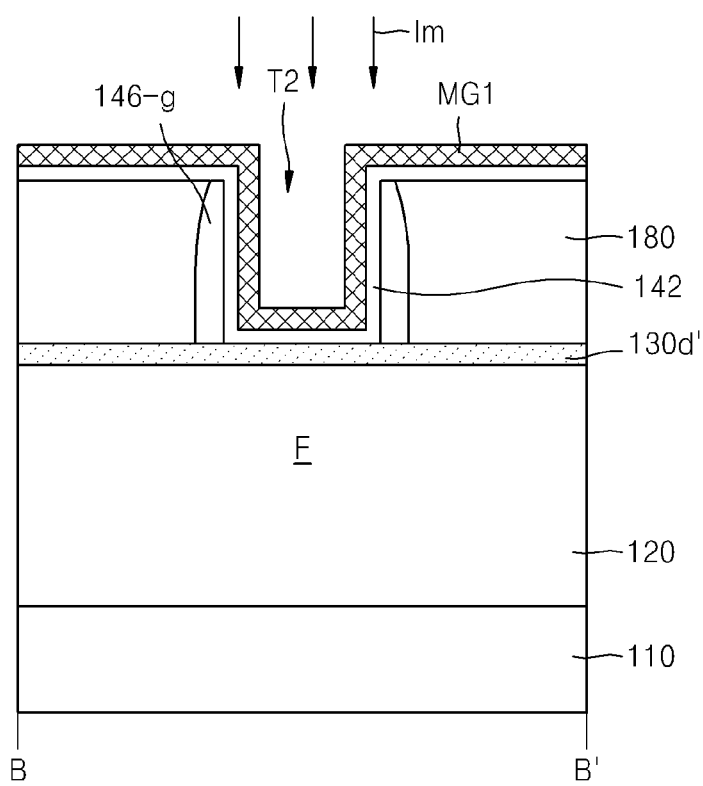

Referring to FIGS. 18I, 21A, and 21B, the dielectric layer 142 is formed to cover an inside of the second trench T2 and an upper surface of the third insulating layer 180, and a pre-first metal layer (not shown) is formed on the dielectric layer 142. The dielectric layer 142 may be or include, for example, a high-k dielectric material.

The pre-first metal layer is a layer in which the ions are implanted later, and thus, may be or include metal, a work function of which may be increased by the ion implantation. For example, the pre-first metal layer may be or include TiN, but is not limited thereto. For example, the various metal materials described with reference to FIG. 1 may be used to form the pre-first metal layer. The pre-first metal layer may be formed by a deposition method such as a PVD or a CVD method. If necessary, the pre-first metal layer may be formed by a plating method using a seed layer. If the first metal layer MG1 is configured to have a multi-layered structure like in the MOSFET 100c of FIG. 6, the layers included in the multi-layered structure may be sequentially formed in this process.

After forming the pre-first metal layer, ions are implanted into the pre-first metal layer as denoted by the arrows Im. The ions may be, for example, N ions, O ions, Cl ions, Br ions, or the like. The pre-first metal layer may be or include TiN, and in this case, the N ions may be implanted into the pre-first metal layer. As such, the first metal layer MG1 having an increased work function may be formed by implanting the ions in the pre-first metal layer.

Figure 18J:
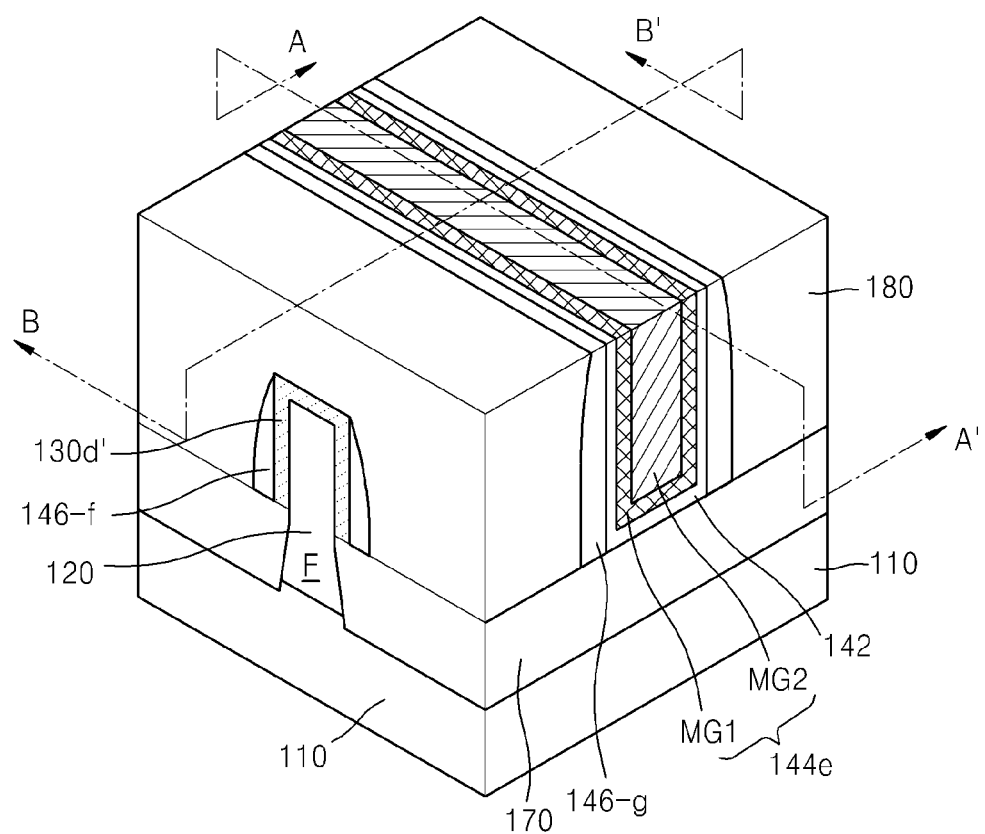
Figure 22A:
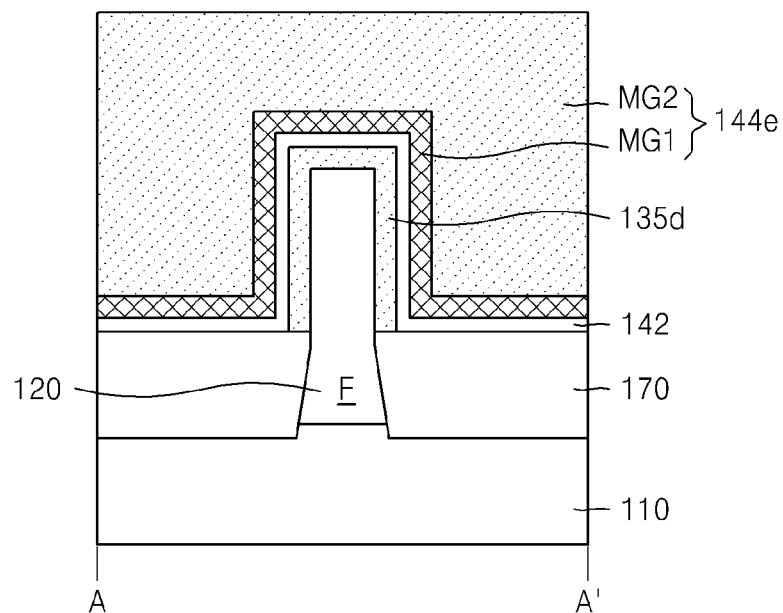
Figure 22B:
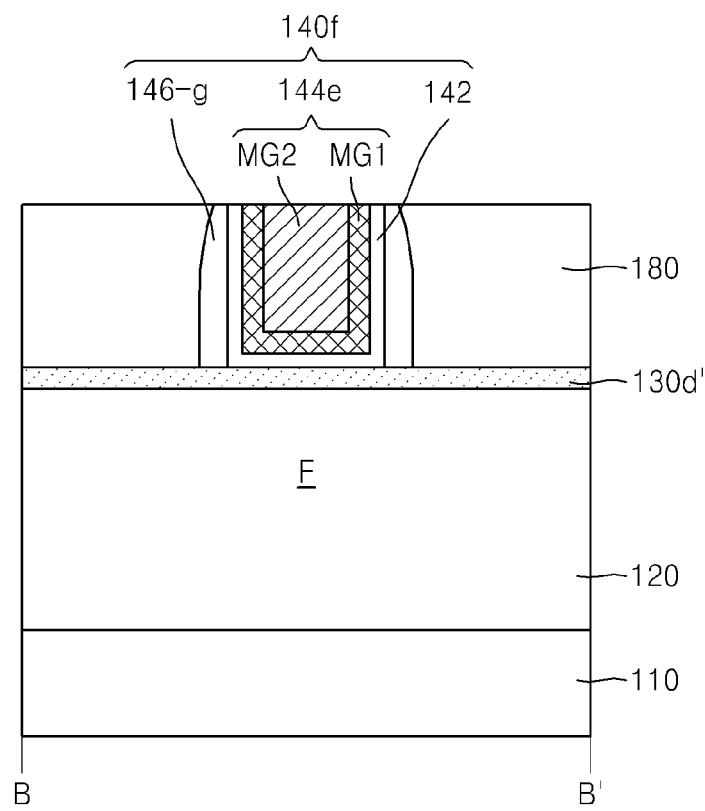

Referring to FIGS. 18J, 22A, and 22B, the second metal layer MG2 is formed on the first metal layer MG1. The second metal layer MG2 may be or include a metal material having a good gap fill property and may be easily removed by a polishing process. For example, the second metal layer MG2 may be or include W, Al, Ti, TiN, or the like. The ions may not be implanted into the second metal layer MG2; however, the example embodiments are not limited thereto.

Then, the gate structure 140f may be completed by removing the dielectric layer 142, the first metal layer MG1, and the second metal layer MG2 on the third insulating layer 180. The gate structure 140f may be formed by a damascene process using the third insulating layer 180 and the spacers 146 as a mold.

Figure 18K:
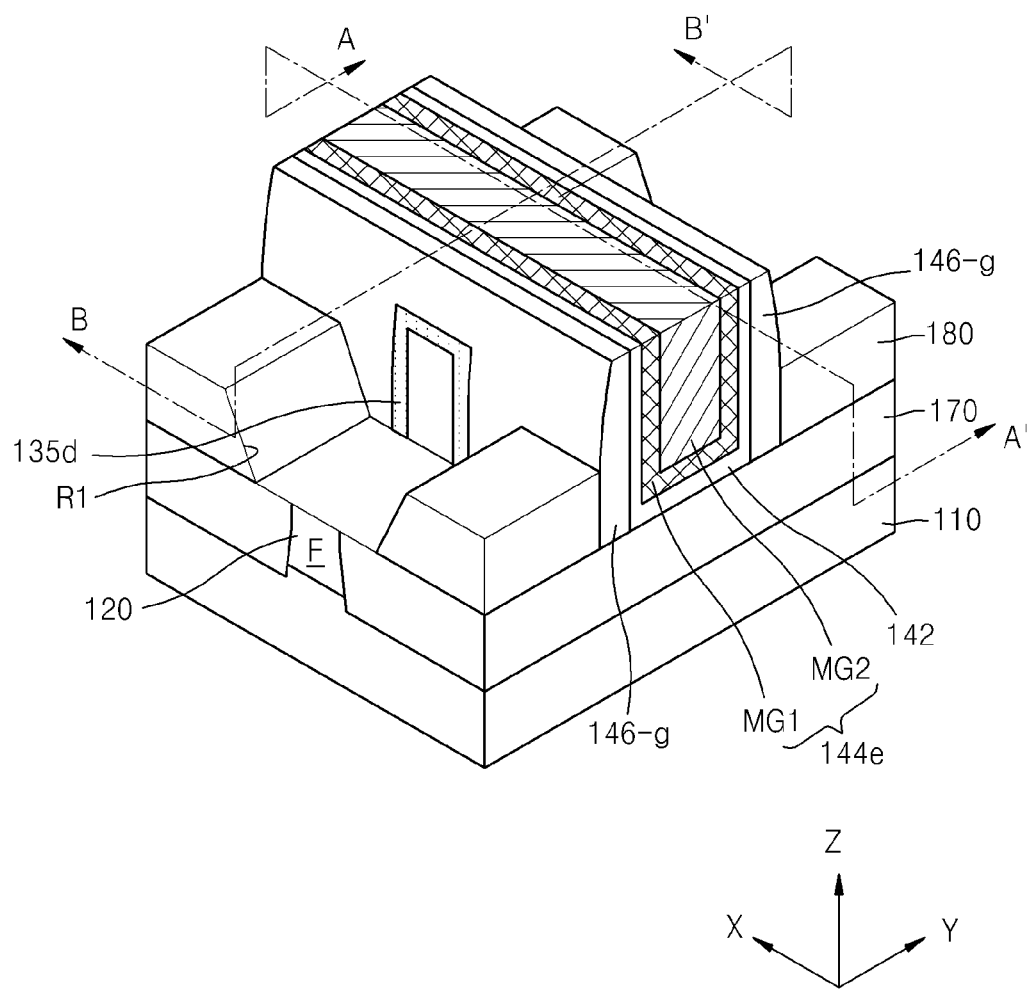
Figure 23A:
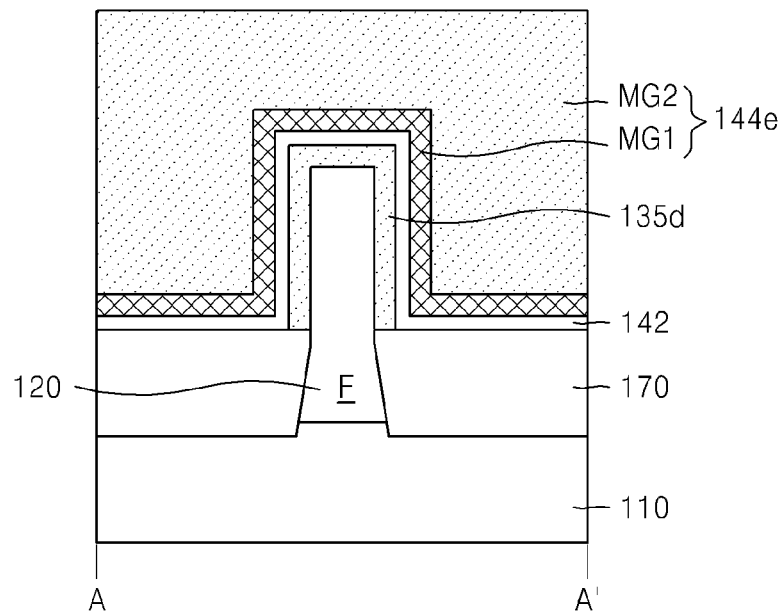
Figure 23B:
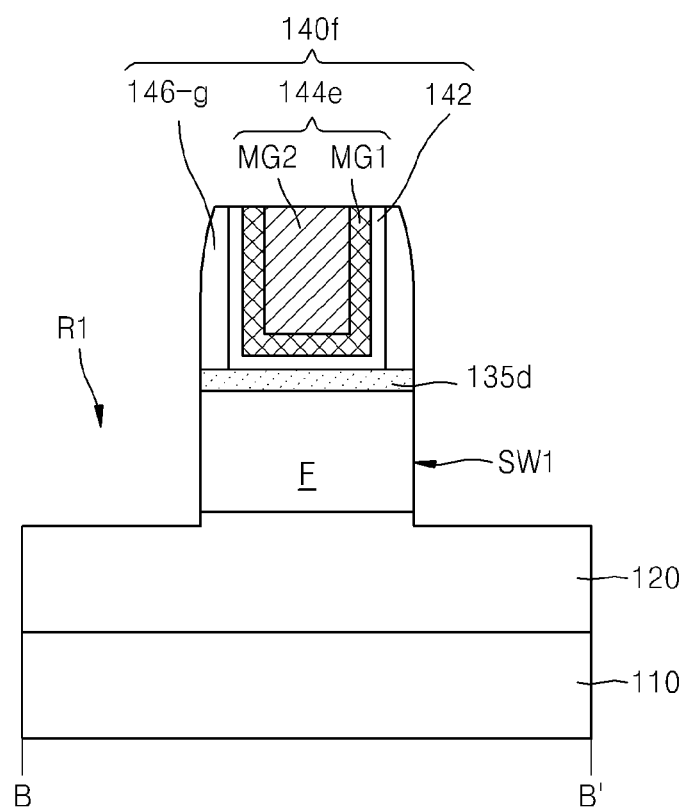

Referring to FIGS. 18K, 23A, and 23B, recess regions R1 may be formed on opposite sides of the gate structure 140f. The recess regions R1 may be formed by patterning the upper portions of the third insulating layer 180, the semiconductor layer 130d', and the fin structure F. The forming process of the recess regions R1 may include a plurality of etching processes.

For example, the upper portion of the third insulating layer 180 is selectively etched to expose the semiconductor layer 130d', and after that, the semiconductor layer 130d' and the fin structure F are etched to form the recess regions R1. The spacer 146 is or includes a material having an etch selectivity with respect to the third insulating layer 180 so as to protect the side walls of the gate electrode 144e when removing the third insulating layer 180. The fin spacer 146-f on the side walls of the semiconductor layer 130d' may be removed with the third insulating layer 180 after removing the semiconductor layer 130d'. Although not shown in the drawings, some of the fin spacer 146-f on the side walls of the semiconductor layer 130d' may remain. Since the recess regions R1 are formed, the semiconductor layer 130d' remains only on the regions where the gate structure 140f and the fin structure F cross each other to exist as the channel region 135d. Also, since the recess regions R1 are formed, an upper portion of the fin structure F is etched, and a first side wall SW1 may be formed around the lower portion of the gate structure 140f. In addition, the recess regions R1 may expose the side walls of the channel region 135d and the side walls of the fin structure F that crosses the gate structure 140f.

Referring back to FIG. 16, the source and drain regions 132d may be located in the recess regions R1. The source and drain regions 132d may be formed by the regrowth of the semiconductor layer or the deposition process. The source and drain regions 132d may contact the side walls of the channel region 135d and the first side wall SW1 of the fin structure F, which are exposed by the spacer 146. For example, the source and the drain regions 132d may be an elevated source and drain having an upper surface that is located higher than the upper surface of the channel region 135d. The source and drain regions 132d and the gate electrode 144e may be insulated from each other by the spacer 146.

Figure 24:
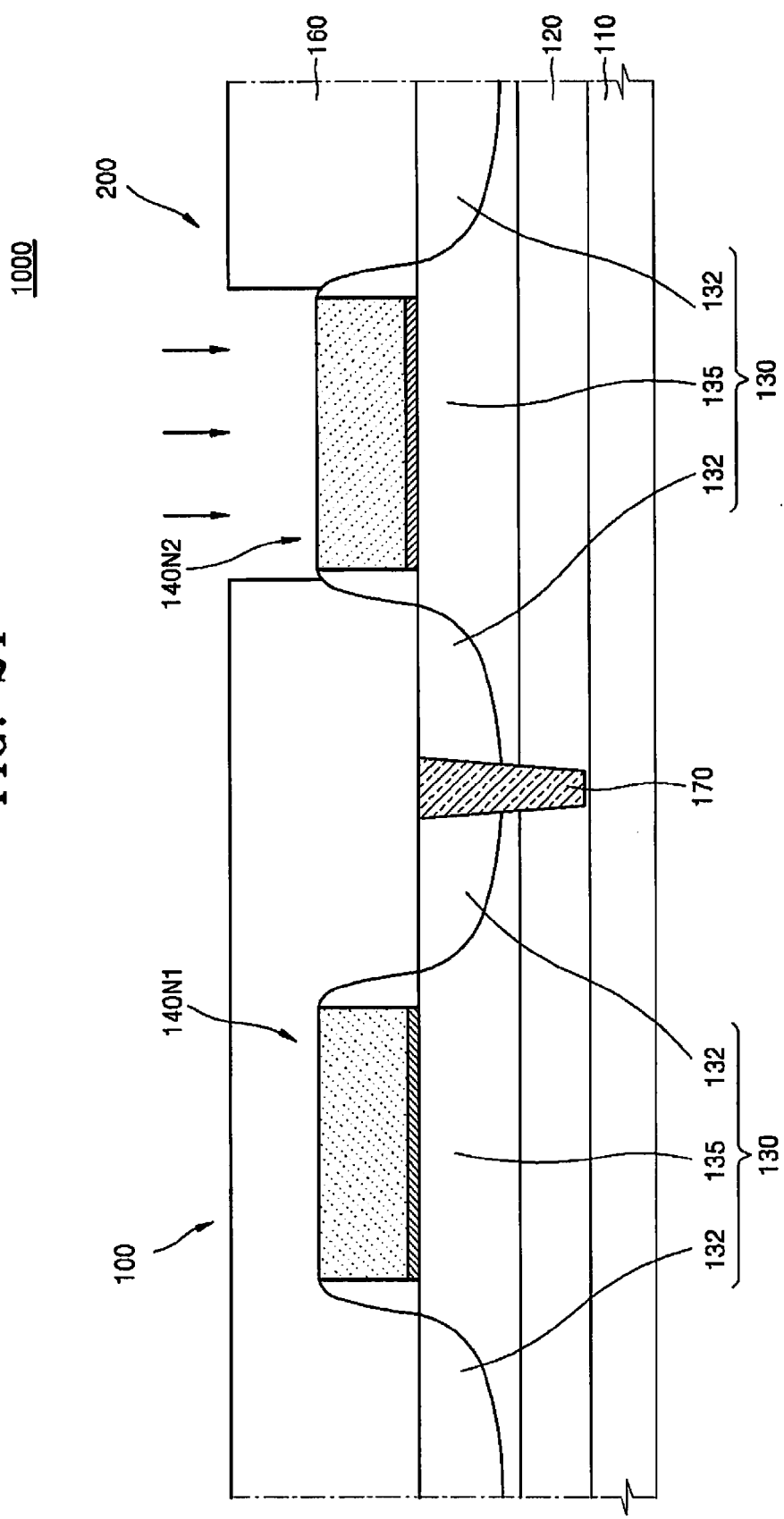
FIG. 24 is a cross-sectional view of a semiconductor device including a plurality of MOSFETs according to an example embodiment.

FIG. 24 is a cross-sectional view of a semiconductor device 1000 including a plurality of MOSFETs according to an example embodiment.

Referring to FIG. 24, the semiconductor device 1000 of the example embodiment includes at least two MOSFETs on the substrate 110. For example, the semiconductor device 1000 may include a first MOSFET 100 and a second MOSFET 200 on the substrate 110 as shown in FIG. 24.

In the semiconductor device 1000 of the example embodiment, the first MOSFET 100 and the second MOSFET 200 may be the same kind of MOSFETs or different kinds of MOSFETs. If the first and second MOSFETs 100 and 200 are the same kind of MOSFETs, the first and second MOSFETs 100 and 200 may be NMOSs which may be or include the same material and have the same structure as the material and structure of the MOSFET 100 described with reference to FIG. 1. The structures of the first and second MOSFETs 100 and 200 are not limited to the structure MOSFET 100 of FIG. 1, but may have various structures shown in FIGS. 4 through 8, 12, 14, and 16.

In addition, even if the first and second MOSFETs 100 and 200 are formed as NMOSs, the first and second MOSFETs 100 and 200 may have different threshold voltages. For example, each of the first and second MOSFETs 100 and 200 may include the substrate 110, the buffer layer 120, the semiconductor layer 130, and the gate structure 140 as described with the MOSFET 100 of FIG. 1. However, processing conditions for implanting the ions when the gate structures 140 in the first and second MOSFETs 100 and 200 may be different from each other. For example, doping concentrations of the implanted ions or the kinds of implanted ions may be different from each other. By differentiating the processing conditions of the ion implantations, the work functions of the gate electrodes in the gate structures 140N1 and 140N2 of the first and second MOSFETs 100 and 200 may be different from each other, and accordingly, the first and second MOSFETs 100 and 200 may have different threshold voltages from each other. For example, the threshold voltage of the first MOSFET 100 may be 0.4 V, and the threshold voltage of the second MOSFET 200 may be 0.33 V.

Here, reference numeral 170 may denote a device isolation layer for electrically isolating the first and second MOSFETs 100 and 200 from each other. Also, reference numeral 160 may denote a hard mask for selectively performing the ion implantation. The hard mask 160 may be patterned to open the gate structure to which the ions are to be implanted. For example, as shown in FIG. 24, if the ions are implanted into the gate electrode of the gate structure 140N2 of the second MOSFET 200, the hard mask 160 may be patterned to open the gate structure 140N2 of the second MOSFET 200 and close the gate structure 140N1 of the first MOSFET 100.

The structure including two MOSFETs is described above; however, the semiconductor device 1000 may include three or more MOSFETs. Also, if the semiconductor device 1000 includes three or more MOSFETs, three or more different threshold voltages corresponding to the MOSFETs may be obtained, for example, 0.4 V, 0.33 V, 0.25 V, etc. In addition, the semiconductor device 1000 of the example embodiment may include different kinds of MOSs, or may include CMOSs.

For example, the semiconductor device 1000 according to the example embodiment may be a logic device including a plurality of the MOSFETs of the same kind or a plurality of the MOSFETs of different kinds. The MOSFETs included in the logic device may have different threshold voltages. Therefore, according to the semiconductor device 1000 of the example embodiment, the channel region is formed by using the group III-V compound semiconductor, and the MOSFETs having different threshold voltages are formed by implanting the ions in the gate electrodes under different processing conditions. Thus, the logic device of high performance and reliability may be realized.

Figure 25:
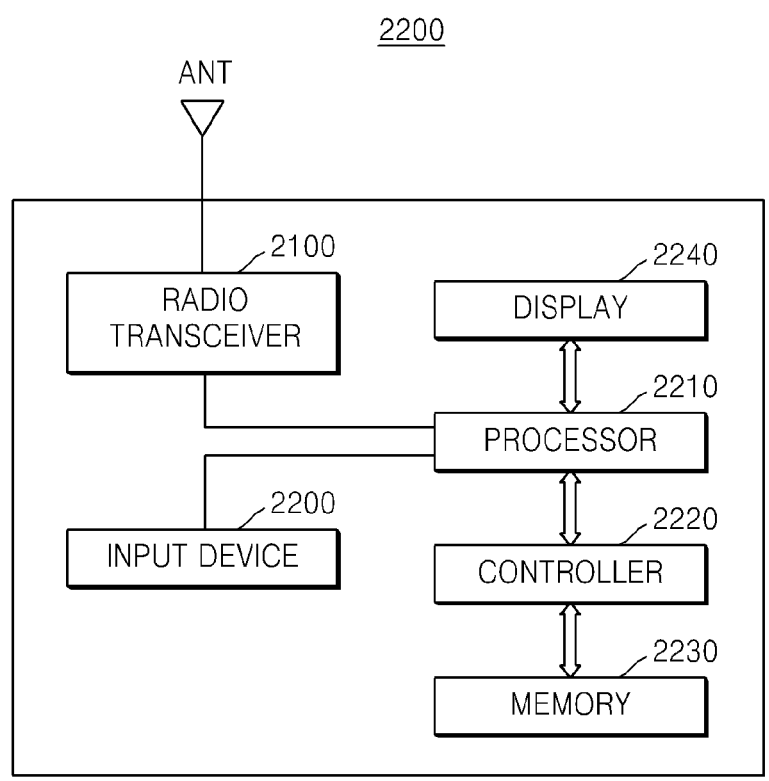
FIGS. 25 through 27 are block diagrams of an electronic system including at least one of MOSFETs according to one or more example embodiments.
Figure 26:
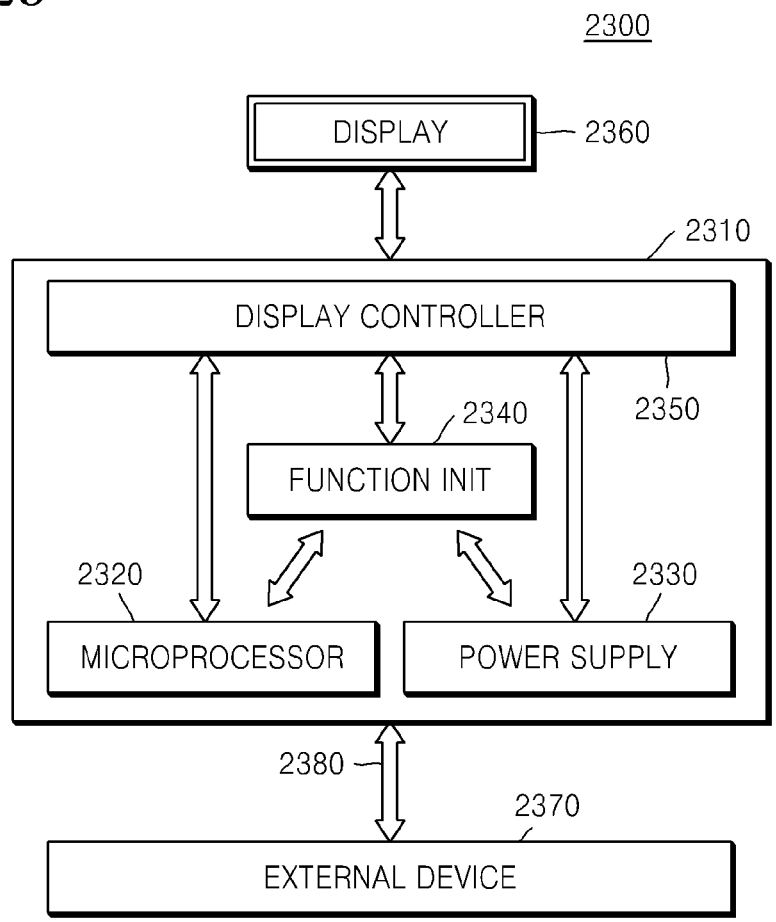
Figure 27:
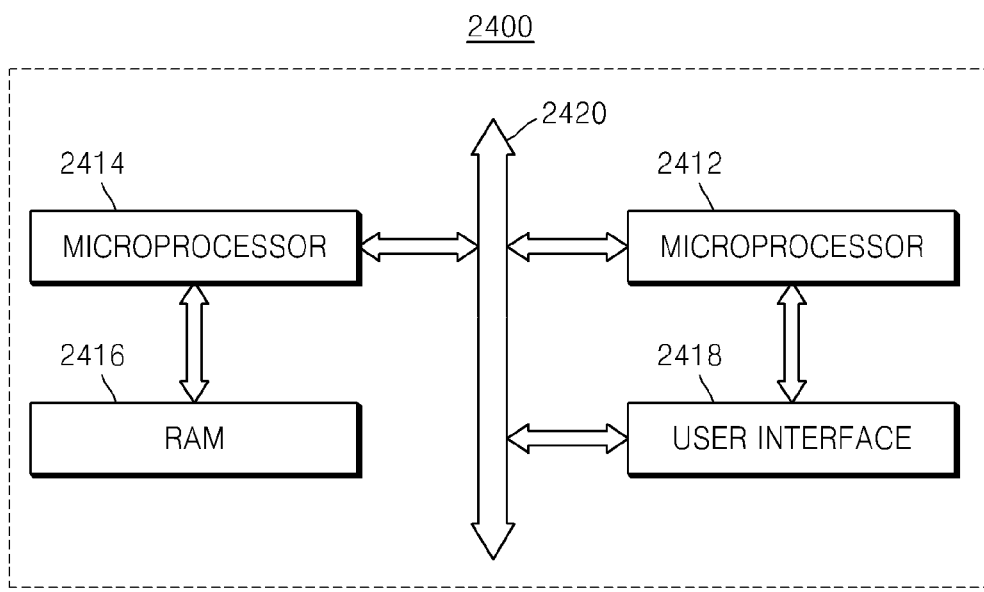

FIGS. 25 through 27 are block diagrams of electronic systems each including at least one of the MOSFETs according to the example embodiments.

Referring to FIG. 25, the electronic system 2200 according to an example embodiment may include a cellular phone, a smartphone, or a tablet PC. The electronic system 2200 may include a processor 2210, a controller 2220, a memory 2230, a display 2240, an input device 2250, and a radio transmitting/receiving unit 2260.

The processor 2210 may include at least one of the MOSFETs according to the example embodiments. The processor 2210 may transmit/receive signals to/from the controller 2220. The controller 2220 may transmit/receive data to/from the memory 2230. For example, the processor 2210 may transmit or receive data to or from the memory 2230 via the controller 2220. If necessary, the MOSFETs according to the example embodiments may be used in the controller 2220 and/or the memory 2230.

The memory 2230 may include a DRAM or a flash memory. The processor 2210 may transmits an electric signal to the display 2240. The display 2240 may generate visual images by receiving the electric signals from the processor 2210.

The processor 2210 may receive an input of a command signal from the input device 2250. The input device 2250 may include a pointing device such as a touch pad or a computer mouse, a keypad, or a keyboard. The processor 2210 may communicate with the radio transmitting/receiving unit to transmit or receive data.

The radio transmitting/receiving unit 2260 converts an electric wave signal transmitted via an antenna ANT into an electric signal to transmit the electric signal to the processor 2210, or converts an electric signal transmitted from the processor 2210 into an electric wave signal to send the electric wave signal to outside.

Referring to FIG. 26, the MOSFETs according to the example embodiments may be applied to the electronic system 2300. The electronic system 2300 may include a body 2310.

The body 2310 may include a micro processor 2320, a power supply 2330, a functional unit 2340, and/or a display controller 2350. The body 2310 may be a system board or a mother board having a printed circuit board (PCB).

The micro processor 2320, the power supply 2330, the functional unit 2340, and the display controller 2350 may be mounted on the body 2310. A display 2360 may be disposed on an upper surface or an outside of the body 2310. For example, the display 2360 may be disposed on the surface of the body 2310 to display images processed by the display controller 2350.

The power supply 2330 receives a desired, or alternatively predetermined voltage from an external power source and branches the voltage into various voltage levels to supply the voltages to the micro processor 2320, the functional unit 2340, the display controller 2350, and the like. The micro processor 2320 receives the voltage from the power supply 2330 to control the functional unit 2340 and the display 2360. The functional unit 2340 may perform functions of the various electronic systems 2300.

For example, if the electronic system 2300 is a mobile electronic device such as a mobile phone, the functional unit 2340 may include various components that may perform wireless communication such as image output to the display 2360 or voice output to a speaker through a dialing operation or communication with an external apparatus 2370. If the functional unit 2340 includes a camera, the functional unit 2340 may function as an image processor.

In another example embodiment, if the electronic system 2300 is connected to a memory card for increasing capacity, the functional unit 2340 may be a memory card controller. The functional unit 2340 may transmit and receive signals to/from the external apparatus 2370 via a wired or wireless communication unit 2380.

Also, if the electronic system 2300 requires a universal serial bus (USB) for expanding functions, the functional unit 2340 may perform as an interface controller. At least one of the MOSFETs according to the example embodiments may be included in at least one of the micro processor 2320 and the functional unit 2340.

Referring to FIG. 27, an electronic system 2400 may include at least one of the MOSFETs according to the example embodiments. The electronic system 2400 may include a mobile device or a computer.

For example, the electronic system 2400 may include a memory system 2412, a micro processor 2414, a RAM 2416, and a user interface 2418 performing data communication by using a bus 2420. The micro processor 2414 may program or control the electronic system 2400.

The RAM 2416 may be used as an operating memory of the micro processor 2414. For example, the micro processor 2414 or the RAM 2416 may include at least one of the MOSFETs according to the example embodiments.

The micro processor 2414, the RAM 2416, and/or other components may be assembled in a single package. The user interface 2418 may be used to input data to the electronic system 2400 or output data from the electronic system 2400.

The memory system 2412 may store codes for operating the micro processor 2414, data processed by the micro processor 2414, or data input from outside. The memory system 2412 may include a controller and a memory.

Figure 28:
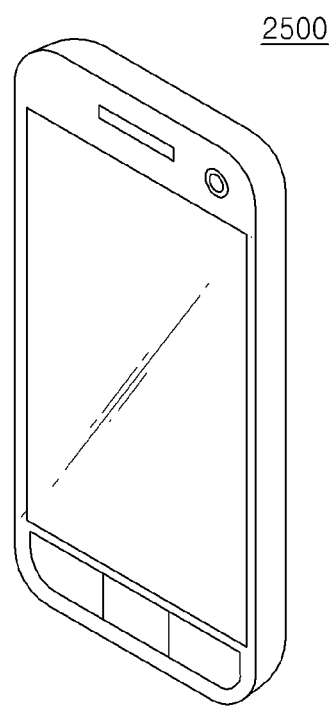
FIG. 28 is a perspective view of a mobile device that is an example application of the electronic system including at least one of MOSFETs according to one or more example embodiments.

FIG. 28 is a schematic perspective view of a mobile device 2500 as an example of an electronic system including at least one of the MOSFETs according to the example embodiments.

Referring to FIG. 28, the mobile device 2500 may include a mobile phone or a tablet PC. In addition, at least one of the MOSFETs according to the example embodiments may be used in a portable computer such as a laptop computer, an mpeg-1 audio layer 3 (MP3) player, an MP4 player, a navigation system, a solid state disk (SSD), a table computer, an automobile, and a home electric appliance, in addition to the mobile phone or the tablet PC.

While the inventive concepts have been particularly shown and described with reference to example embodiments thereof, it will be understood that various changes in form and details may be made therein without departing from the spirit and scope of the following claims.

What is claimed is:

1. A metal-oxide semiconductor field effect transistor (MOSFET) comprising:
    a substrate;
    a semiconductor layer including a group III-V compound on the substrate; and a gate structure on the semiconductor layer, the gate structure including a gate electrode and a dielectric layer between the gate electrode and the semiconductor layer, the gate electrode including an ion-implanted first metal layer on the dielectric layer and a second metal layer on the first metal layer, wherein the first metal layer includes titanium nitride (TiN)/titanium aluminum carbide (TiAlC)/TiN layers.

2. The MOSFET of claim 1, wherein the second metal layer comprises at least a tungsten (W) layer.

3. The MOSFET of claim 1, wherein the first metal layer includes at least one TiN layer, the TiN layer being nitrogen (N) ions-implanted.

4. The MOSFET of claim 1, further comprising a buffer layer on the substrate.

5. The MOSFET of claim 4, wherein the substrate comprises silicon (Si), the semiconductor layer includes a channel region including indium gallium arsenide (InGaAs) or indium arsenide (InAs), and the buffer layer includes one or more gallium arsenide (GaAs)/indium phosphate (InP)/indium aluminum arsenide (InAlAs) layers.

6. The MOSFET of claim 1, wherein the gate electrode comprises a metal having a work function of substantially 4.5 eV or greater.

7. The MOSFET of claim 1, wherein the gate electrode comprises at least one of rhenium (Re), iridium (Ir), platinum (Pt) and palladium (Pd).

8. The MOSFET of claim 1, wherein the semiconductor layer comprises a channel region, a source region, and a drain region, wherein the channel region is under the gate structure, the source region and the drain region are at opposite side surfaces of the channel region, and the MOSFET is a planar type in which the channel region is flat or a fm type in which the channel region protrudes from the substrate.

9. The MOSFET of claim 8, wherein the semiconductor layer comprises InGaAs, the source region and the drain region include at least one of Si ions and tin (Sn) ions.

10. The MOSFET of claim 8, wherein the semiconductor layer includes InAs, the source region and the drain region include at least one of carbon (C) ions, Si ions, and Sn ions.

11. The MOSFET of claim 1, wherein the first metal layer surrounds a lower surface and lateral surfaces of the second metal layer.

12. The MOSFET of claim 1, further comprising a buffer layer between the substrate and the semiconductor layer, wherein the substrate is a Si substrate, the semiconductor layer includes a channel region including InGaAs or InAs, the buffer layer includes GaAs/InP/InAlAs layers.

13. The MOSFET of claim 1, wherein the MOSFET is one of an N-channel MOS (NMOS), a P-channel MOS (PMOS), and a complementary MOS (CMOS).

14. A semiconductor apparatus comprising:
a substrate;
a buffer layer on the substrate;
a semiconductor layer including a group III-V compound on the buffer layer; and
at least two gate structures on the semiconductor layer, each gate structure including a gate electrode, the gate electrode being metal-based and ion-implanted, wherein the at least two gate structures form at least two transistors with corresponding parts of the semiconductor layer, the at least two transistors have different threshold voltages from each other, and the gate electrodes in the at least two transistors have different doping concentrations or different ions from each other, wherein the gate electrodes include an ion-implanted first metal layer and a second metal layer on the first metal layer, and wherein the first metal layer includes titanium nitride (TiN)/titanium aluminum carbide (TiAlC)/TiN layers.

15. The semiconductor apparatus of claim 14, wherein the substrate comprises silicon (Si), the semiconductor layer includes a channel region including indium gallium arsenide (InGaAs) or indium arsenide (InAs), the buffer layer includes one or more gallium arsenide (GaAs)/indium phosphate (InP)/indium aluminum arsenide (InAlAs) layers, and the gate electrodes in the at least two transistors have nitrogen (N) ions at different doping concentrations.

16. The semiconductor apparatus of claim 14, wherein the at least two transistors form a logic device.

17. A metal-oxide semiconductor field effect transistor (MOSFET) comprising:
a substrate;
a semiconductor layer including a group II-V compound on the substrate; and
a gate electrode on the semiconductor layer, the gate electrode being ion-implanted;

wherein a work function of the gate electrode is increased based on at least one of a type and concentration of the implanted one or more ions, and the gate electrode comprises at least a first metal layer and a second metal layer, the first metal layer being implanted with the one or more ions, and wherein the first metal layer includes titanium nitride (TiN)/titanium aluminum carbide (TiAlC)/TiN layers.

18. The MOSFET of claim 17, wherein the implanted one or more ions comprise at least one of nitrogen ion, oxygen ions, chlorine ions and bromine ions.

19. The MOSFET of claim 17, wherein a dielectric layer is disposed between the gate electrode and the semiconductor layer, and the first metal layer is between the second metal layer and the dielectric layer.

20. The MOSFET of claim 17, wherein
the second metal layer includes at least one tungsten (W) layer; and
the semiconductor layer includes a channel region including InGaAs or InAs.

21. The MOSFET of claim 17, further comprising a buffer layer between the semiconductor layer and the substrate, the buffer layer including one or more GaAs/InP/InAlAs layers.

* * * * *